United States Patent
Nelson et al.

(10) Patent No.: US 8,536,889 B2
(45) Date of Patent: Sep. 17, 2013

(54) ELECTRICALLY CONDUCTIVE PINS FOR MICROCIRCUIT TESTER

(75) Inventors: John E. Nelson, Brooklyn Park, MN (US); Jeffrey C. Sherry, Savage, MN (US); Patrick J. Alladio, Santa Rosa, CA (US); Russell F. Oberg, Beldenville, WI (US); Brian Warwick, Ben Lomond, CA (US); Gary W. Michalko, Ham Lake, MN (US)

(73) Assignee: Johnstech International Corporation, Minneapolis, MN (US)

( * ) Notice: Subject to any disclaimer, the term of this patent is extended or adjusted under 35 U.S.C. 154(b) by 445 days.

(21) Appl. No.: 12/721,039

(22) Filed: Mar. 10, 2010

(65) Prior Publication Data

US 2010/0231251 A1 Sep. 16, 2010

Related U.S. Application Data

(60) Provisional application No. 61/158,934, filed on Mar. 10, 2009, provisional application No. 61/307,100, filed on Feb. 23, 2010.

(51) Int. Cl.
*G01R 31/20* (2006.01)
*G01R 31/00* (2006.01)

(52) U.S. Cl.
USPC ............ 324/754.01; 324/755.01; 324/756.01

(58) Field of Classification Search
None
See application file for complete search history.

(56) References Cited

U.S. PATENT DOCUMENTS

| | | | |
|---|---|---|---|
| 4,544,886 A | 10/1985 | Murray et al. | |
| 5,098,311 A * | 3/1992 | Roath et al. | 439/295 |
| 5,611,705 A | 3/1997 | Pfaff | |
| 5,829,988 A | 11/1998 | McMillan et al. | |
| 6,027,346 A | 2/2000 | Sinsheimer et al. | |
| 6,062,870 A | 5/2000 | Hopfer, III et al. | |
| 6,069,481 A | 5/2000 | Matsumura | |
| 6,154,040 A | 11/2000 | Tsukamoto et al. | |
| 6,181,149 B1 | 1/2001 | Godfrey et al. | |
| 6,202,297 B1 | 3/2001 | Faraci et al. | |
| 6,208,155 B1 | 3/2001 | Barabi et al. | |
| 6,299,459 B1 | 10/2001 | Botka et al. | |
| 6,337,577 B1 | 1/2002 | Doherty et al. | |
| 6,396,293 B1 | 5/2002 | Vinther et al. | |
| 6,397,460 B1 | 6/2002 | Hembree | |
| 6,426,553 B2 | 7/2002 | Inomata | |
| 6,497,581 B2 | 12/2002 | Slocum et al. | |

(Continued)

OTHER PUBLICATIONS

International Search Report for PCT/US2010/026767.

*Primary Examiner* — Vinh Nguyen
(74) *Attorney, Agent, or Firm* — Altera Law Group, LLC

(57) ABSTRACT

The terminals of a device under test are temporarily electrically connected to corresponding contact pads on a load board by a series of electrically conductive pin pairs. The pin pairs are held in place by an interposer membrane that includes a top contact plate facing the device under test, a bottom contact plate facing the load board, and a vertically resilient, non-conductive member between the top and bottom contact plates. Each pin pair includes a top and bottom pin, which extend beyond the top and bottom contact plates, respectively, toward the device under test and the load board, respectively. The top and bottom pins contact each other at an interface that is inclined with respect to the membrane surface normal. When compressed longitudinally, the pins translate toward each other by sliding along the interface. The sliding is largely longitudinal, with a small and desirable lateral component determined by the inclination of the interface.

20 Claims, 17 Drawing Sheets

(56) References Cited

U.S. PATENT DOCUMENTS

| | | |
|---|---|---|
| 6,958,616 B1 | 10/2005 | Mahoney et al. |
| 6,975,127 B2 | 12/2005 | DiOrio |
| 6,980,015 B2 | 12/2005 | Johnson |
| 6,981,881 B2 | 1/2006 | Adachi et al. |
| 7,021,944 B2 | 4/2006 | Adachi et al. |
| 7,043,831 B1 | 5/2006 | Farnworth et al. |
| 7,090,522 B2 | 8/2006 | Sinclair |
| 7,219,426 B2 * | 5/2007 | Haga ................................ 29/874 |
| 7,233,156 B2 | 6/2007 | Yanagisawa et al. |
| 7,293,994 B2 | 11/2007 | Brodsky et al. |
| 7,695,286 B2 * | 4/2010 | Swart et al. ....................... 439/66 |
| 2001/0011724 A1 | 8/2001 | Maruyama et al. |
| 2002/0000815 A1 | 1/2002 | Fjelstad et al. |
| 2002/0028596 A1 * | 3/2002 | Soejima ......................... 439/357 |
| 2002/0133941 A1 | 9/2002 | Akram et al. |
| 2005/0009385 A1 | 1/2005 | Korsunsky et al. |
| 2005/0073334 A1 | 4/2005 | Farnworth et al. |
| 2005/0099763 A1 | 5/2005 | Rathburn |
| 2005/0101164 A1 | 5/2005 | Rathburn |
| 2005/0181655 A1 | 8/2005 | Haba et al. |
| 2005/0260868 A1 | 11/2005 | Lee |
| 2005/0275084 A1 | 12/2005 | Kirby et al. |
| 2006/0035483 A1 | 2/2006 | Rathburn et al. |
| 2006/0046554 A1 | 3/2006 | Cram et al. |
| 2006/0113107 A1 | 6/2006 | Williams |
| 2006/0116004 A1 | 6/2006 | Rathburn |
| 2006/0145719 A1 | 7/2006 | Jeong et al. |
| 2006/0160379 A1 | 7/2006 | Rathburn |
| 2006/0208751 A1 | 9/2006 | Chen |
| 2007/0066094 A1 | 3/2007 | Kim et al. |
| 2007/0170942 A1 | 7/2007 | Akram et al. |
| 2007/0197099 A1 | 8/2007 | Di Stefano |
| 2007/0269999 A1 | 11/2007 | Di Stefano |
| 2007/0275572 A1 | 11/2007 | Williams et al. |
| 2008/0020566 A1 | 1/2008 | Egitto et al. |
| 2008/0042250 A1 | 2/2008 | Wilson et al. |
| 2008/0064236 A1 | 3/2008 | Lin et al. |
| 2008/0182436 A1 | 7/2008 | Rathburn |
| 2008/0194124 A1 | 8/2008 | Di Stefano |
| 2009/0075529 A1 | 3/2009 | Johnston et al. |
| 2009/0189622 A1 | 7/2009 | Tan |
| 2009/0302878 A1 | 12/2009 | Sherry et al. |
| 2010/0120265 A1 | 5/2010 | Nakamura et al. |

* cited by examiner

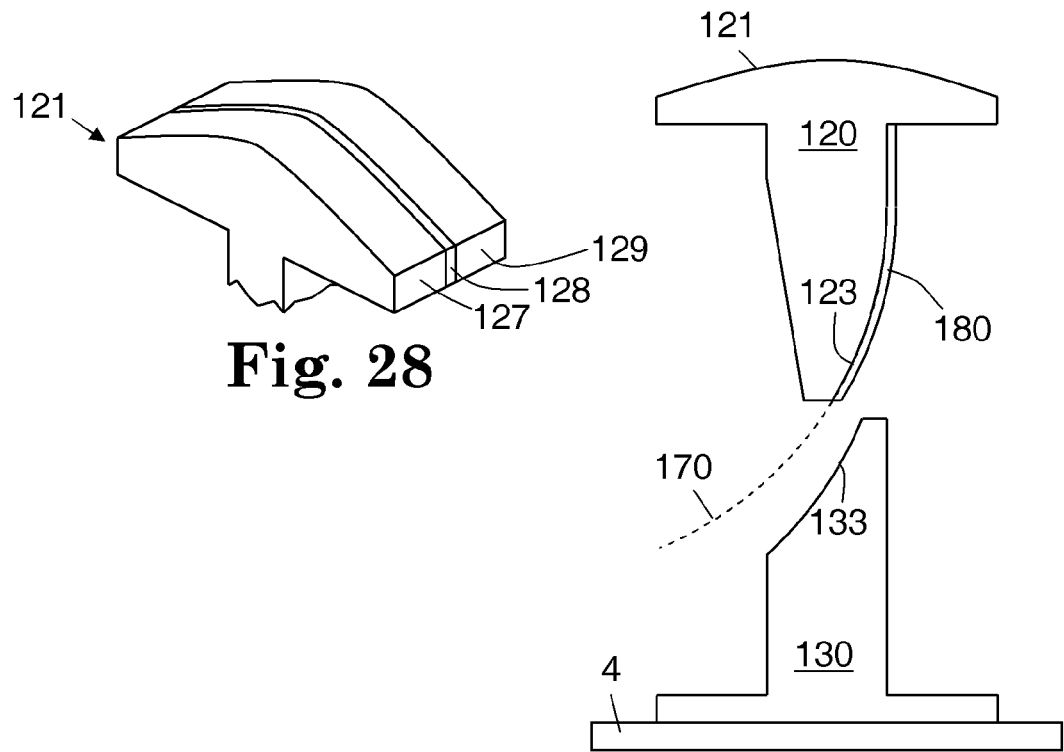

SECTION VIEWS THROUGH SLOT

ELECTRICALLY CONDUCTIVE PINS FOR MICROCIRCUIT TESTER

CROSS-REFERENCE TO RELATED APPLICATIONS

This application claims priority of provisional application No. 61/158,934, filed on Mar. 10, 2009 and provisional application No. 61/307,100, filed on Feb. 23, 2010, which hereby is incorporated herein by reference in its entirety.

STATEMENT REGARDING FEDERALLY SPONSORED RESEARCH OR DEVELOPMENT

Not Applicable

BACKGROUND OF THE INVENTION

1. Field of the Invention

The present invention is directed to equipment for testing microcircuits.

2. Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board. When the device under test is forced into contact with the tester, the pins complete the circuits between respective device under test contacts and corresponding load board pads. After testing, when the device under test is released, the terminals separate from the pins and the circuits are broken.

The present application is directed to improvements to these pins.

There is a type of testing known as "Kelvin" testing, which measures the resistance between two terminals on the device under test. Basically, Kelvin testing involves forcing a current to flow between the two terminals, measuring the voltage difference between the two terminals, and using Ohm's Law to derive the resistance between the terminals, given as the voltage divided by the current. Each terminal on the device under test is electrically connected to two contact pads on the load board. One of the two pads supplies a known current amount of current. The other pad is a high-impedance connection that acts as a voltmeter, which does not draw any significant amount of current. In other words, each terminal on the device under test that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals on the load board and four contact pads.

In this application, the pins that form the temporary electrical connections between the device under test and the load board may be used in several manners. In a "standard" test, each pin connects a particular terminal on the device under test to a particular pad on the load board, with the terminals and pads being in a one-to-one relationship. For these standard tests, each terminal corresponds to exactly one pad, and each pad corresponds to exactly one terminal. In a "Kelvin" test, there are two pins contacting each terminal on the device under test, as described above. For these Kelvin tests, each terminal (on the device under test) corresponds to two pads (on the load board), and each pad (on the load board) corresponds to exactly one terminal (on the device under test). Although the testing scheme may vary, the mechanical structure and use of the pins is essentially the same, regardless of the testing scheme.

There are many aspects of the testbeds that may be incorporated from older or existing testbeds. For instance, much of the mechanical infrastructure and electrical circuitry may be used from existing test systems, and may be compatible with the electrically conductive pins disclosed herein. Such existing systems are listed and summarized below.

An exemplary microcircuit tester is disclosed in United States Patent Application Publication Number US 2007/0202714 A1, titled "Test contact system for testing integrated circuits with packages having an array of signal and power contacts", invented by Jeffrey C. Sherry, published on Aug. 30, 2007 and incorporated by reference herein in its entirety.

For the tester of '714, a series of microcircuits is tested sequentially, with each microcircuit, or "device under test", being attached to a testbed, tested electrically, and then removed from the testbed. The mechanical and electrical aspects of such a testbed are generally automated, so that the throughput of the testbed may be kept as high as possible.

In '714, a test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal. Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

In '714, a plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slots separating fingers could be plated to create an I-beam, thereby preventing fingers from deforming, and also increasing life.

The connection vias of '714 may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes of '714 may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

In '714, the device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O. The device I/O may be physically close to the load board, thus improving electrical performance.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer project a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.4 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test contact arrangement has short signal paths.

Third, solders commonly in use today for BGA terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

BGA test contacts currently known and used in the art employ spring pins made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. US 2004/0201390 A1, titled "Test interconnect for bumped semiconductor components and method of fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches a topography of the bumped contacts. The leads can be formed by forming a patterned metal layer on the substrate, by attaching a polymer substrate with the leads thereon to the substrate, or by etching the substrate to form conductive beams.

According to U.S. Pat. No. 6,246,249 B1, titled "Semiconductor inspection apparatus and inspection method using the apparatus" and issued on Jun. 12, 2001 to Fukasawa, et al., a semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion. A test contact element of the invention for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

In U.S. Pat. No. 5,812,378, titled "Microelectronic connector for engaging bump leads" and issued on Sep. 22, 1998 to Fjelstad, et al., a connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts. According to United States Patent Application Publication No. US 2001/0011907 A1, titled "Test interconnect for bumped semiconductor components and method of fabrication" and published on Aug. 9, 2001, an interconnect for testing semiconductor components includes a substrate, and contacts on the substrate for making temporary electrical connections with bumped contacts on the components. Each contact includes a recess and a support member over the recess configured to electrically engage a bumped contact. The support member is suspended over the recess on spiral leads formed on a surface of the substrate. The spiral leads allow the support member to move in a z-direction within the recess to accommodate variations in the height and planarity of the bumped contacts. In addition, the spiral leads twist the support member relative to the bumped contact to facilitate penetration of oxide layers thereon. The spiral leads can be formed by attaching a polymer substrate with the leads thereon to the substrate, or by forming a patterned metal layer on the substrate. In an alternate embodiment contact, the support member is suspended over the surface of the substrate on raised spring segment leads.

BRIEF SUMMARY OF THE INVENTION

An embodiment is a replaceable, longitudinally compressible membrane (10) for forming a plurality of temporary mechanical and electrical connections between a device under test (1) having a plurality of terminals (2) and a load board (3) having a plurality of contact pads (4), each contact pad (4) being laterally arranged to correspond to exactly one terminal (2), comprising: a flexible, electrically insulating top contact plate (40) longitudinally adjacent to the terminals (2) on the device under test (1); a flexible, electrically insulating bottom contact plate (60) longitudinally adjacent to the contact pads (4) on the load board (3); a longitudinally resilient, electrically insulating interposer (50) between the top and bottom contact plates (40, 60); a plurality of longitudinally compressible, electrically conductive pin pairs (20, 30) extending through longitudinal holes in the top contact plate (40), the interposer (50) and the bottom contact plate (60), each pin pair in the plurality being laterally arranged to correspond to exactly one terminal (2) on the device under test (1). When a particular pin pair (20, 30) is longitudinally compressed, the pins (20, 30) in the pair slide past each other along a virtual interface surface (70) that is inclined with respect to a surface normal of the interposer (50).

Another embodiment is a test fixture (5), comprising: a membrane (10) extending laterally between a device under test (1) and a load board (3), the device under test (1) including a plurality of electrical terminals (2) arranged in a predetermined pattern, the load board (3) including a plurality of electrical contact pads (4) arranged in a predetermined pattern corresponding to that of the terminals (2), the membrane having a top side facing the terminals (2) of the device under test (1) and a bottom side facing the contact pads (4) of the load board (3); a plurality of electrical pin pairs (20, 30) supported by the membrane (10) in a predetermined pattern corresponding to that of the terminals (2), each pin pair in the plurality comprising: a top pin (20) extending through the top side of the membrane (10) and having a top pin mating surface (23); and a bottom pin (30) extending through the bottom side of the membrane (10) and having a bottom pin mating surface (33). The top and bottom pin mating surfaces (23, 33) have complementary surface profiles. When the corresponding electrical terminal (2) is forced against the pin pair, the top and bottom pin mating surfaces (23, 33) slide along each other along a virtual interface surface (70). The virtual interface surface (70) is inclined with respect to a surface normal of the membrane (10).

A further embodiment is a test fixture (5) for forming a plurality of temporary mechanical and electrical connections between a device under test (1) having a plurality of terminals (2) and a load board (3) having a plurality of contact pads (4), the terminals (2) and contact pads (4) being arranged in a one-to-one correspondence, comprising: a replaceable interposer membrane (10) disposed generally parallel to and adjacent to the load board (3), the interposer membrane (10) including a plurality of pin pairs (20, 30) arranged in a one-to-one correspondence with the plurality of terminals (2), each pin pair (20, 30) including a top pin (20) adjacent to the corresponding terminal (2) and extending into the interposer membrane, and a bottom pin (30) adjacent to the corresponding contact pad (4) and extending into the interposer membrane (10). Each contact pad (4) corresponding to a particular pin pair (20, 30) is configured to mechanically and electrically receive the terminal (2) on the device under test (1) corresponding to the particular pin pair (20, 30). When the device under test (1) is attached to the test fixture (5), the top pins (20) contact the corresponding terminals (2) on the device under test (1), the bottom pins (30) contact the corresponding contact pads (4) on the load board (3), each top pin (20) contacts the corresponding bottom pin (30) along a virtual interface surface that is inclined with respect to a surface normal of the interposer membrane (10), and the plurality of terminals (2) on the device under test (1) are electrically connected in a one-to-one correspondence to the plurality of contact pads (4) on the load board (3).

BRIEF DESCRIPTION OF THE SEVERAL VIEWS OF THE DRAWINGS

FIG. 28 is a plan drawing of an exemplary top contact pad for Kelvin testing, with an insulating portion that separates the two halves of the pad.

FIG. 29 is a side-view drawing of an exemplary pin pair for Kelvin testing, with an insulating ridge that extends outward from the top pin mating surface.

DETAILED DESCRIPTION OF THE INVENTION

Figure 1:
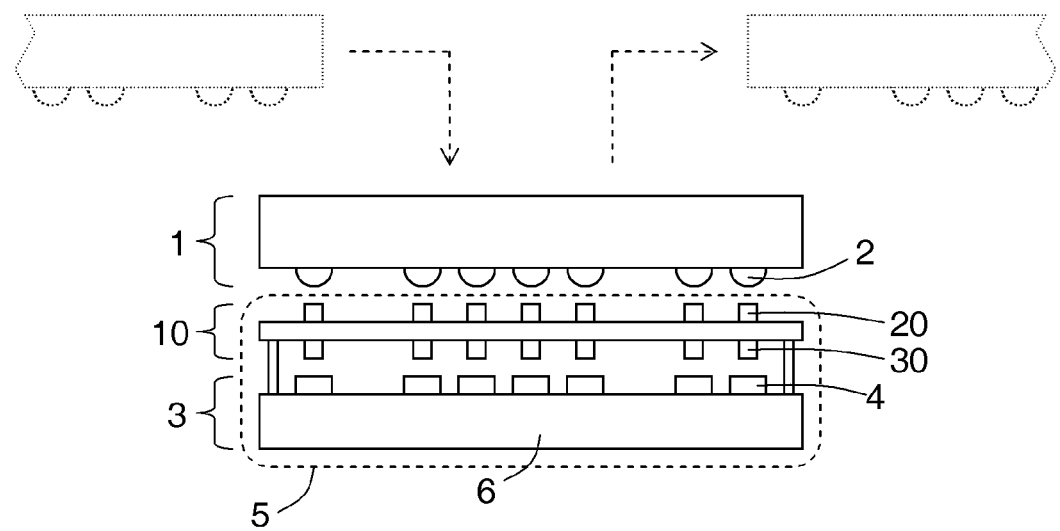
FIG. 1 is a side-view drawing of a portion of the test equipment for receiving a device under test (DUT).

Consider an electrical chip that is manufactured to be incorporated into a larger system. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test", is tested, and is then detached from the tester. In general, it is desirable to perform the attachment, testing, and detachment as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Most testers of this type use mechanical contacts between the chip pins and the tester contacts, rather than soldering and de-soldering or some other attachment method. When the chip is attached to the tester, each pin on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip pins. For instance, it is not desirable to scrape the device I/O (leads, pins, pads or balls), bend or deflect the I/O, or perform any operation that might permanently change or damage the I/O in any way. Typically, the testers are designed to leave the chips in a final state that resembles the initial state as closely as possible. In addition, it is also desirable to avoid or reduce any permanent damage to the tester or tester pads, so that tester parts may last longer before replacement.

There is currently a great deal of effort spent by tester manufacturers on the pad layouts. For instance, the pads may include a spring-load mechanism that receives the chip pins with a prescribed resisting force. In some applications, the pads may have an optional hard stop at the extreme end of the spring-load force range of travel. The goal of the pad layout is to establish a reliable electrical connection with the corresponding chip pins, which may be as close as possible to a "closed" circuit when the chip is attached, and may be as close as possible to an "open" circuit when the chip is detached.

Because it is desirable to test these chips as quickly as possible, or simulate their actual use in a larger system, it may be necessary to drive and/or receive electrical signals from the pins at very high frequencies. The test frequencies of current-day testers may be up to 40 GHz or more, and the test frequencies are likely to increase with future generation testers.

For low-frequency testing, such as that done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip I/O and the corresponding pad on the load card be sufficiently low, which maintains a target impedance of 50 ohms, so that the tester itself does not significantly distort the electrical performance of the chip under test. Note that most test equipment is designed to have 50 ohm input and output impedances.

For modern-day chips that have many, many closely spaced I/O, it becomes helpful to simulate the electrical and mechanical performance at the device I/O interface. Finite-element modeling in two- or three dimensions has become a tool of choice for many designers. In some applications, once a basic geometry style has been chosen for the tester pad configuration, the electrical performance of the pad configuration is simulated, and then the specific sizes and shapes may be iteratively tweaked until a desired electrical performance is achieved. For these applications, the mechanical performance may be determined almost as an afterthought, once the simulated electrical performance has reached a particular threshold.

A general summary of the disclosure follows.

The terminals of a device under test are temporarily electrically connected to corresponding contact pads on a load board by a series of electrically conductive pin pairs. The pin pairs are held in place by an interposer membrane that includes a top contact plate facing the device under test, a bottom contact plate facing the load board, and a vertically resilient, non-conductive member between the top and bottom contact plates. Each pin pair includes a top and bottom pin, which extend beyond the top and bottom contact plates, respectively, toward the device under test and the load board, respectively. The top and bottom pins contact each other at an interface that is inclined with respect to the membrane surface normal. When compressed longitudinally, the pins translate toward each other by sliding along the interface. The sliding is largely longitudinal, with a small and desirable lateral component determined by the inclination of the interface. The interface may optionally be curved along one or two dimensions, optionally with different curvatures and/or concavities in each direction, and may optionally include one or more locating features, such as a ridge or groove. The top and bottom contact plates may be made from a polyimide or non-conductive, flexible material, such as KAPTON, which is commercially available from the DuPont Corporation. Another example material is polyetheretherketone (PEEK), an engineering plastic commercially available from manufacturers such as Victrex. The material between the contact plates may be a foam or elastomeric material. The pins in each pair may optionally be made from different metals.

The preceding paragraph is merely a summary of the disclosure, and should not be construed as limiting in any way. The test device is described in much greater detail below.

FIG. 1 is a side-view drawing of a portion of the test equipment for receiving a device under test (DUT) 1. The DUT 1 is placed onto the tester 5, electrical testing is performed, and the DUT 1 is then removed from the tester 5. Any electrical connections are made by pressing components into electrical contact with other components; there is no soldering or de-soldering at any point in the testing of the DUT 1.

The entire electrical test procedure may only last about a fraction of a second, so that rapid, accurate placement of the device under test 1 becomes important for ensuring that the test equipment is used efficiently. The high throughput of the tester 5 usually requires robotic handling of the devices under test 1. In most cases, an automated mechanical system places the DUT 1 onto the tester 5 prior to testing, and removes the DUT 1 once testing has been completed. The handling and placement mechanism may use mechanical and optical sensors to monitor the position of the DUT 1, and a combination of translation and rotation actuators to align and place the DUT 1 on the testbed. Such automated mechanical systems are mature and have been used in many known electrical testers; these known robotic systems may also be used with any or all of the tester elements disclosed herein. Alternatively, the DUT 1 may be placed by hand, or placed by a combination of hand-fed and automated equipment.

Likewise, the electrical algorithms that are used to test each terminal on the DUT 1 are well established, and have been used in many known electrical testers. These known electrical algorithms may also be used with any or all of the tester elements disclosed herein.

The device under test 1 typically includes one or more chips, and includes signal and power terminals that connect to the chip. The chip and terminals may be on one side of the device under test 1, or may be on both sides of the device under test 1. For use in the tester 5, all the terminals 2 should be accessible from one side of the device under test 1, although it will be understood that there may be one or more elements on the opposite side of the device under test 1, or that there may be other elements and/or terminals on the opposite side that may not be tested by accessing terminals 2.

Each terminal 2 is formed as a small, generally spherical ball of solder. Prior to testing, the ball 2 is attached to an electrical lead that connects internally to other leads, to other electrical components, and/or to one or more chips on the device under test 1. The volume and size of the solder balls may be controlled quite precisely, and there is typically not much difficulty caused by ball-to-ball size variations or placement variations. During testing, the terminals 2 remain solid, and there is no melting or re-flowing of any solder balls 2.

The terminals 2 may be laid out in any suitable pattern on the surface of the device under test 1. In some cases, the terminals 2 may be in a generally square grid, which is the origin of an expression that describes the device under test 1, "ball grid array". There may also be deviations away from a rectangular grid, including irregular spacings and geometries. It will be understood that the specific locations of the terminals may vary as needed, with corresponding locations of pads on the load board and pin pairs on the membrane being chosen to match those of the device under test terminals 2. In general, the spacing between adjacent terminals 2 is in the range of 0.25 to 1.5 mm, with the spacing being commonly referred to as a "pitch".

When viewed from the side, as in FIG. 1, the device under test 1 displays a line of terminals 2, which may optionally include gaps and irregular spacings. These terminals 2 are made to be generally planar, or as planar as possible with typical manufacturing processes. In many cases, if there are chips or other elements on the device under test 1, the protrusion of the chips is usually less than the protrusion of the terminals 2 away from the device under test 1.

The tester 5 of FIG. 1 includes a load board 3.

The load board 3 includes a load board substrate 6 and circuitry that is used to test electrically the device under test 1. Such circuitry may include driving electronics that can produce one or more AC voltages having one or more particular frequencies, and detection electronics that can sense the response of the device under test 1 to such driving voltages. The sensing may include detection of a current and/or voltage at one or more frequencies. Such driving and sensing electronics is well known in the industry, and any suitable electronics from known testers may be used with the tester elements disclosed herein.

In general, it is highly desirable that the features on the load board 3, when mounted, are aligned with corresponding features on the device under test 1. Typically, both the device under test 1 and the load board 3 are mechanically aligned to one or more locating features on the tester 3. The load board 3 may include one or more mechanical locating features, such as fiducials or precisely-located holes and/or edges, which ensure that the load board 3 may be precisely seated on the tester 5. These locating features typically ensure a lateral alignment (x, y) of the load board, and/or a longitudinal alignment (z) as well. The mechanical locating features are well known in the industry, and any suitable electronics from known testers may be used with the tester elements disclosed herein. The mechanical locating features are not shown in FIG. 1.

In general, the load board 3 may be a relatively complex and expensive device. In many cases, it may be advantageous to introduce an additional, relatively inexpensive element into the tester 5 that protects the contact pads 4 of the load board 3 from wear and damage. Such an additional element may be an interposer membrane 10. The interposer membrane 10 also mechanically aligns with the tester 3 with suitable locating features (not shown), and resides in the tester 5 above the load board 3, facing the device under test 1.

The interposer membrane 10 includes a series of electrically conductive pin pairs 20, 30. In general, each pin pair connects one contact pad 4 on the load board 3 to one terminal 2 on the device under test 1, although there may be testing schemes in which multiple contact pads 4 connect to a single terminal 2, or multiple terminals 2 connect to a single contact pad 4. For simplicity, we assume in the text and drawings that a single pin pair connects a single pad to a single terminal, although it will be understood that any of the tester elements disclosed herein may be used to connect multiple contact pads connect to a single terminal, or multiple terminals to a single contact pad. Typically, the interposer membrane 10 electrically connects the load board pads and the bottom contact surface of the test contactor. It may alternatively be used to convert an existing load board pad configuration to a vehicle, which is a test socket used to connect and test a device under test.

Although the interposer membrane 10 may be removed and replaced relatively easily, compared with removal and replacement of the load board 3, we consider the interposer membrane 10 to be part of the tester 5 for this document. During operation, the tester 5 includes the load board 3, the interposer membrane 10, and the mechanical construction that mounts them and holds them in place (not shown). Each device under test 1 is placed against the tester 5, is tested electrically, and is removed from the tester.

A single interposer membrane 10 may test many devices under test 1 before it wears out, and may typically last for several thousand tests or more before requiring replacement. In general, it is desirable that replacement of the interposer membrane 10 be relatively fast and simple, so that the tester 5 experiences only a small amount of down time for membrane replacement. In some cases, the speed of replacement for the interposer membrane 10 may even be more important than the actual cost of each membrane 10, with an increase in tester up-time resulting in a suitable cost savings during operation.

FIG. 1 shows the relationship between the tester 5 and the devices under test 1. When each device 1 is tested, it is placed into a suitable robotic handler with sufficiently accurate placement characteristics, so that a particular terminal 2 on the device 1 may be accurately and reliably placed (in x, y and z) with respect to corresponding pin pairs 20, 30 on the interposer membrane 10 and corresponding contact pads 4 on the load board 3.

The robotic handler (not shown) forces each device under test 1 into contact with the tester 5. The magnitude of the force depends on the exact configuration of the test, including the number of terminals 2 being tested, the force to be used for each terminal, typical manufacturing and alignment tolerances, and so forth. In general, the force is applied by the mechanical handler of the tester (not shown), acting on the device under test 1. In general, the force is generally longitudinal, and is generally parallel to a surface normal of the load board 3.

Figure 2:
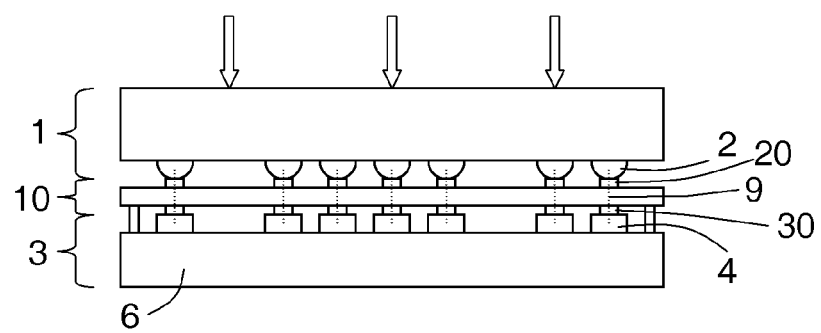
FIG. 2 is a side-view drawing of the test equipment of FIG. 1, with the DUT electrically engaged.

FIG. 2 shows the tester and device under test 1 in contact, with sufficient force being applied to the device under test 1 to engage the pin pairs 20, 30 and form an electrical connection 9 between each terminal 2 and its corresponding contact pad 4 on the load board 3. As stated above, there may alternatively be testing schemes in which multiple terminals 2 connect to a single contact pad 4, or multiple contact pads 4 connect to a single terminal 2, but for simplicity in the drawings we assume that a single terminal 2 connects uniquely to a single contact pad 4.

Figure 3:
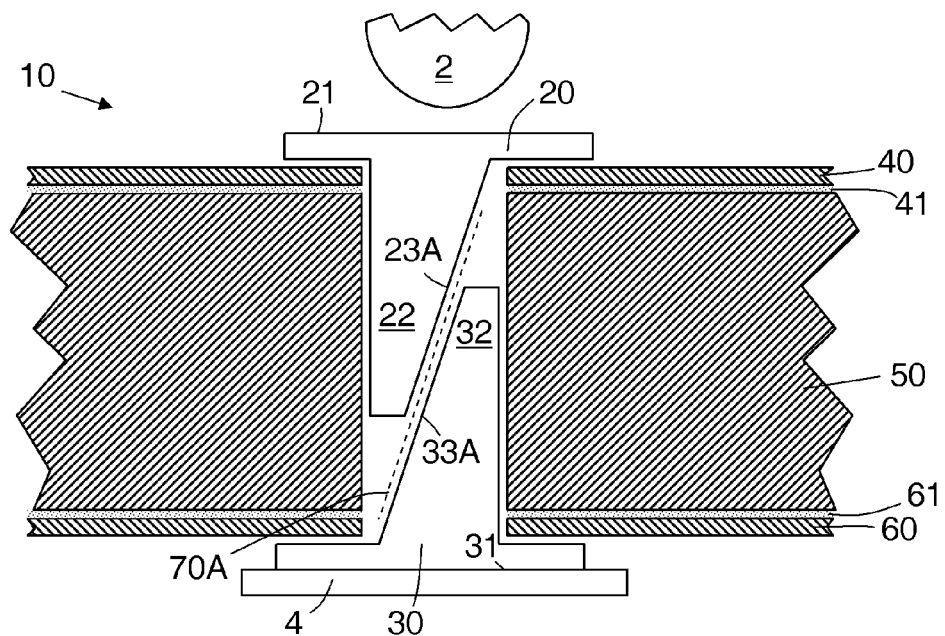
FIG. 3 is a side-view cross-sectional drawing of an exemplary interposer membrane in its relaxed state.
Figure 4:
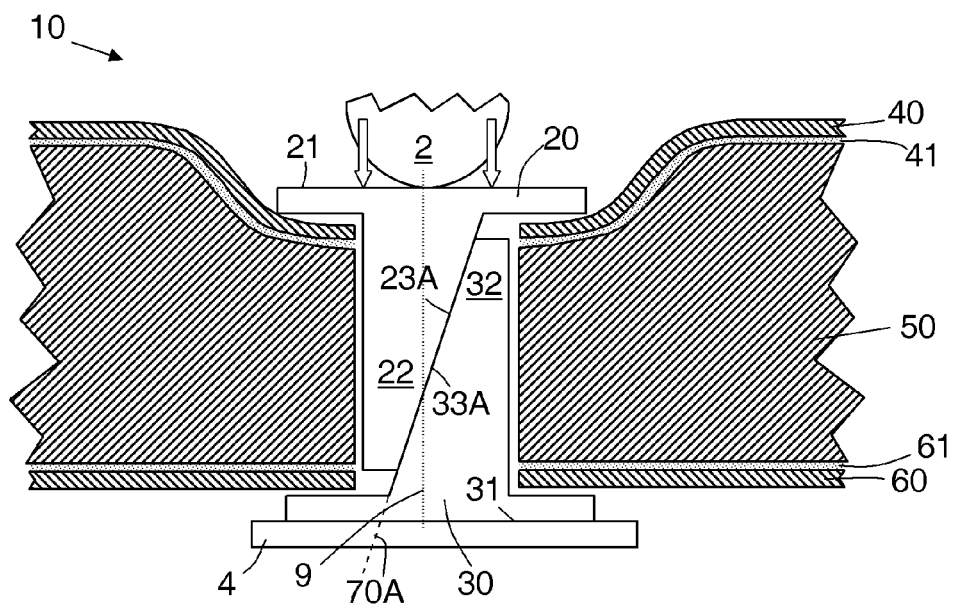
FIG. 4 is a side-view cross-sectional drawing of the interposer membrane of FIG. 3, in its compressed state.

FIGS. 3 and 4 are side-view cross-sectional drawings of an exemplary interposer membrane 10 in its relaxed and compressed states, respectively. In its relaxed state, there is no electrical connection between terminal 2 on the device under test 1 and contact pad 4 on the load board 3. In its compressed state, in which the device under test 1 is forced toward the load board 3, there is an electrical connection 9 between terminal 2 on the device under test 1 and contact pad 4 on the load board 3.

In some cases, the interposer membrane 10 may extend across essentially the entire lateral extent of the load board, or at least over the lateral area subtended by the load board contact pads 4. The membrane 10 includes a sandwich structure that mechanically supports electrically conductive pin pairs, with each pin pair corresponding to a terminal 2 on the device under test 1 and a contact pad 4 on the load board 3. The sandwich structure is described below, followed by a detailed description of the pin pairs.

The membrane 10 may be formed as a sandwich structure, with an interposer 50 being surrounded by a top contact plate 40 and a bottom contact plate 60. In some cases, the layers 40, 50, 60 of the membrane 10 are held together by relatively thin layers of adhesive 41, 61.

The interposer 50 is an electrically insulating, vertically resilient material, such as foam or an elastomer. When the device under test is forced toward the load board, the interposer 50 compresses in the longitudinal (vertical) direction, as is the case in FIG. 4. The vertical compression is generally elastic. When the device under test is released, the interposer 50 expands in the longitudinal (vertical) direction to its original size and shape, as is the case in FIG. 3.

Note that there may optionally be some transverse (horizontal) compression as well, although the transverse component is generally smaller than the longitudinal component. In general, the interposer 50 material does not substantially "flow" laterally when a longitudinal force is applied. In some cases, there may be a resisting lateral force supplied by the interposer 50 material, which can help constrain the pair of pins 20, 30 to a particular columnar volume and prevent or reduce any lateral spreading of the overlapping portions of the pins in each pair.

On either side of the interposer 50 is a contact plate, with a top contact plate 40 facing the device under test 1 and a bottom contact plate 60 facing the load board 3. The contact plates 40, 60 may be made from an electrically insulating, flexible material, such as a polyimide or kapton. Alternatively, the contact plates 40, 60 may be made from any semi-rigid thin film material, which can include a polyester, a polyimide, PEEK, Kapton, nylon, or any other suitable material. In some cases, the contact plates 40, 60 are adhered to the interposer 50 by an adhesive 41, 61. In other cases, the contact plates 40, 60 are made integral with the interposer 50. In still other cases, the contact plates 40, 60 are free floating and not physically attached to the interposer 50, which may allow for quick removal and replacement. For these cases, there is no adhesive 41, 61 that binds the interposer 50 to the contact plates 40, 60.

The contact plates 40, 60 (kapton) are structurally stronger than the interposer 50 (foam), and provide a durable exterior to the interposer membrane 10. In addition, they deform less than the interposer 50 when the device under test 1 is forced toward the load board 3. Note that in FIG. 4, the top contact plate 40 may bend longitudinally to accommodate the longitudinal compression, but the material that actually compresses is the foam or elastomer of the interposer 50. In other words, during compression, the top and bottom contact plate 40, 60 may be pushed toward each other and one or both may longitudinally deform, but neither one significantly compresses or changes thickness.

A membrane 10 that uses kapton contact plates 40, 60 may have several advantages.

First, it is easy and relatively inexpensive to cut and place holes into the semi-rigid film, which may be made from a material such as kapton. As a result, once the lateral locations of the contact pads 4 and the corresponding terminals 2 are determined (usually by the manufacturer of the device under test 1), the locations and sizes may be fed into a machine that drills or etches the holes in the desired locations. Note that the machining/processing of kapton is far less expensive for comparable processing of a metallic layer.

Second, after machining, the kapton layers are very strong, and resist lateral deformation of the hole shapes or locations. As a result, the kapton layers themselves may be used to determine the lateral locations of the pin pairs, during assembly of the interposer membrane 10. In other words, the pins may be inserted into the existing holes in the kapton, eliminating the need for an additional, expensive tool to precisely place the pins in (x, y).

The exemplary membrane 10 shown in FIG. 3 shows the top pin 20 and bottom pin 30 as being spatially separated when the membrane 10 is in its relaxed state. When the membrane 10 is compressed, as in FIG. 4, the top pin 20 and bottom pin 30 are brought into physical and electrical contact.

Note that having a pin separation in the relaxed state is optional. Alternatively, the top and bottom pins may be in physical and electrical contact even when the membrane is in its relaxed state; this is the case of the design discussed below with reference to FIGS. 5 and 6.

Having discussed the sandwich structure of the interposer membrane 10, we turn now to the top pin 20 and bottom pin 30.

The top pin 20, also known as a slider pin 20, has a top contact pad 21 that extends generally laterally around the pin 20 and comes into contact with the terminal 2 on the device under test 1. This lateral extension makes the top contact pad 21 a "larger target" for the terminal 2 during testing, and helps relax some fabrication and alignment tolerances on all the tester and device elements. The top contact pad 21 need not be flat or rectangular in profile; other options are discussed below with reference to FIGS. 12-18.

The top pin 20 has a longitudinal member 22 that extends away from the top contact pad 21 toward the load board 3. In some cases, the longitudinal member 22 may include all of the top pin 20 except the top contact pad 21.

The longitudinal member 22 may include at least one mating surface 23. The mating surface 23 is shaped to contact an analogous mating surface 33 on the bottom pin 30 during longitudinal compression of the pin pair, so that the mating surfaces 23 and 33 on the pin pair provide good mechanical and electrical contact between the top and bottom pins. Here, the element numbers "23" and "33" refer to general mating surfaces. The surfaces themselves may take on many shapes and orientations, and specific shapes are labeled in the drawings as "23A", "33A", "23B", "33B", and so forth. FIGS. 3 and 4 show flat mating surfaces 23A and 33A. Some other suitable shapes are shown below in subsequent drawings.

The bottom pin 30, also known as a base pin 30, has a bottom contact pad 31, a longitudinal member 32 and a mating surface 33A, all of which are similar in construction to the analogous structures in the top pin 20.

In some cases, the top and bottom pins are formed from different metals, so that the pins avoid "sticking" together over the course of repeated contact along the mating surfaces 23A and 33A. Examples of suitable metals include copper, gold, solder, brass, silver, and aluminum, as well as combinations and/or alloys of the above conductive metals.

In the exemplary design of FIGS. 3 and 4, the mating surfaces 23A and 33A are essentially planar. When brought together, the mating surfaces 23A and 33A form a so-called virtual "interface surface" 70A, which in this example is a plane. Other examples are provided below.

Note that the hole in the membrane 10, and likewise the cross-section of the longitudinal members 22 and 32, may be circular, elliptical, elongated, rectangular, square, or any other suitable shape. In all of these cases, the membrane 10 holds the top and bottom pins together, in a manner similar to having a rubber band around the pins' circumference in the vicinity of their overlapping longitudinal portions. The membrane 10 provides resistance to motion in the lateral direction.

Figure 5:
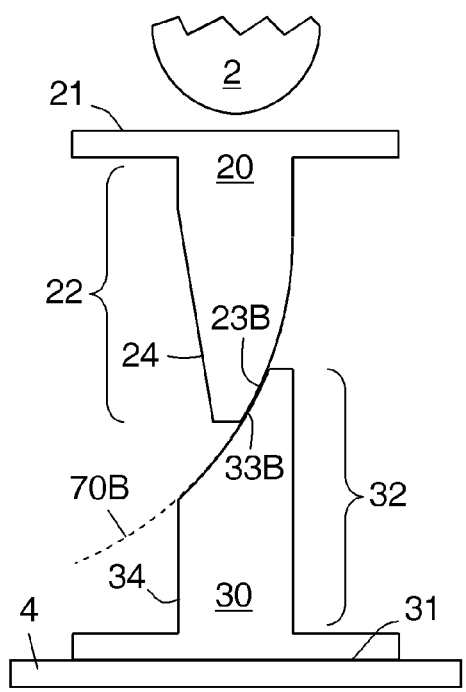
FIG. 5 is a side-view drawing of an exemplary pin pair in its relaxed state.
Figure 6:
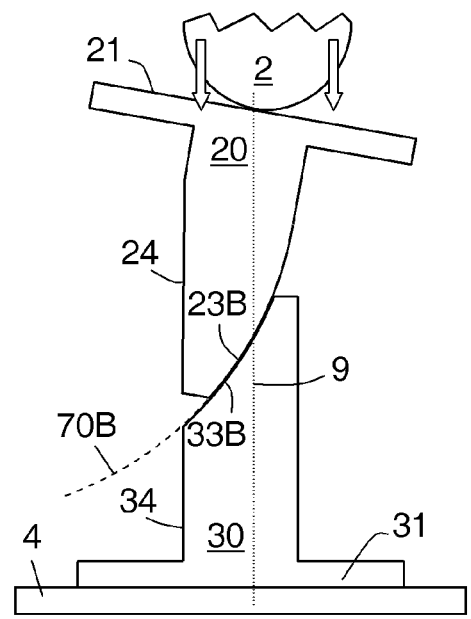
FIG. 6 is a side-view drawing of the pin pair of FIG. 5, in its compressed state.

Whereas the interface surface 70A of FIGS. 3 and 4 is generally planar, the interface surface may alternatively take on other shapes. For instance, the interface surface 70B in FIGS. 5 and 6 is curved. The top pin mating surface 23B is convex, and the bottom pin mating surface 33B is concave, with both having the same radius of curvature so that they fit together.

In FIG. 5, when the membrane is in its relaxed state, the top pin 20 and bottom pin 30 have generally parallel longitudinal members. In FIG. 6, when the device under test is forced against the load board, the top pin 20 has slid along the curved interface surface 70B, thereby translating the top pin 20 downward and pivoting the top pin 20 so that the top contact pad is inclined with respect to the terminal 2 on the device under test, and the top pin longitudinal member is inclined with respect to the bottom pin longitudinal member.

This angular incline may be useful. Note in FIG. 6 that when the electrical connection 9 is made between the terminal (ball) 2 and the load board contact pad 4, that the top contact pad 21 on the top pin 20 contacts the ball 2 away from the center of the ball 2. This shift in contact area may cause a desirable "wiping" function, in which the top contact pad 21 on the top pin 20 can break through any oxide layers that have formed on the solder ball 2. This, in turn, may result in an improved electrical connection between the ball 2 and the top contact pad 21 of the top pin 20.

In addition, depending on the location of the center of rotation of the interface surface 70B, there may be an additional lateral translation of the top pin 20 as the device under test is forced against the load board. Generally, this lateral (x, y) translation is smaller than the longitudinal (z) translation of the top pin, but is desirable nonetheless because it may also cause the "wiping" function described above.

Note that this lateral translation is also present on the designs of FIGS. 3 and 4, in which the interface surface 70A is planar, and is inclined away from a surface normal of the interposer membrane 10. As a result, the designs of FIGS. 3 and 4 display the desirable "wiping" function described above.

Note also that while "wiping" may be desirable for the solder ball terminals 2 on the devices under test, "wiping" is typically not desirable for the contact pads 4 on the load board 3. In general, persistent and repeated wiping of the load board contact pads 4 may lead to deterioration of the pads themselves, and may eventually lead to failure of the load board 3, which is highly undesirable. For the designs considered herein, the top pin 20 is the pin that moves and performs the wiping, while the bottom pin 30 remains generally stationary, and does not wipe against the load board contact pad 4.

Note that the top pin 20 has a top relief surface 24, which is cut away from the top pin longitudinal member so that the top pin may pivot without bumping into the resilient membrane (not shown—on the left portion of FIG. 6). In some cases, when the top pin 20 is at full compression, as in FIG. 6, the top relief surface 24 is perpendicular to the plane of the interposer membrane 10. In the case shown in FIG. 6, the bottom pin 30 includes a bottom relief surface 34 that is perpendicular to the membrane surface, which does not cause any interference with the membrane foam because the bottom pin 30 generally does not pivot.

FIGS. 3 and 4 showed a planar interface surface 70A, and FIGS. 5 and 6 showed a curved interface surface 70B. These and other configurations are shown more clearly in FIGS. 7 through 11.

Figure 7:
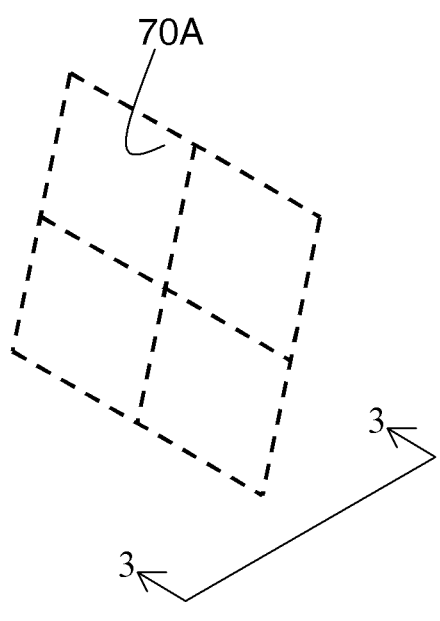
FIG. 7 is a plan drawing of the planar interface surface shown in FIG. 3.

FIG. 7 is a plan drawing of the planar interface surface 70A shown in FIG. 3.

Note that the plane itself is inclined with respect to the surface normal of the interposer membrane 10. In other words, the plane is not truly vertical, but is inclined away from vertical by an angle, such as 1 degree, 5 degree, 10 degrees, 15 degrees, 20 degrees, or an angle within a range of angles, such as 1-30 degrees, 5-30 degrees, 10-30 degrees, 15-30 degrees, 20-30 degrees, 5-10 degrees, 5-15 degrees, 5-20 degrees, 5-25 degrees, 10-15 degrees, 10-20 degrees, 10-25 degrees, 15-20 degrees, 15-25 degrees, or 20-25 degrees. To form this planar interface surface 70A, top pin mating surface 23A and bottom pin mating surface 33A are both planar.

With a planar interface surface 70A, there is no restriction of movement of the top mating surface 23A with respect to the bottom mating surface 33A. The mating surfaces are free to translate and rotate with respect to each other while remaining in contact with each other.

Figure 8:
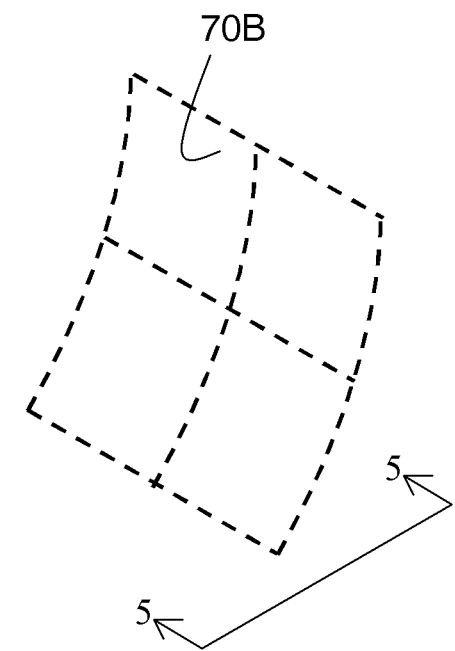
FIG. 8 is a plan drawing of the cylindrically curved interface surface shown in FIG. 5.

FIG. 8 is a plan drawing of the curved interface surface 70B shown in FIG. 5. In this case, the curvature is only along one dimension, so that the interface surface 70B assumes a cylindrical profile. There is curvature along a vertical direction, but no curvature along a horizontal direction. To form this cylindrically curved interface surface 70B, the top pin mating surface 23B is cylindrically curved and convex, and the bottom pin mating surface 33B is cylindrically curved and concave. Each mating surface has the same radius of curvature. Note that in other cases, the concavity may be reversed, so that the top pin mating surface 23B is concave and the bottom pin mating surface 33B is convex.

The curved interface surface 70B does restrict movement of the pins with respect to each other. The mating surfaces of the pins may translate horizontally, along the dimension that has no curvature, and may pivot about the center of curvature (the mating surfaces and interface surface all have the same center of curvature), but may not translate vertically without rotation with respect to each other.

The placement of the center of curvature does determine the amount of rotation and/or lateral translation one may achieve for a given longitudinal translation of the pins. In general, it is desirable to have enough translation and/or rotation to provide adequate "wiping" of the ball terminal 2, as described above.

Figure 9:
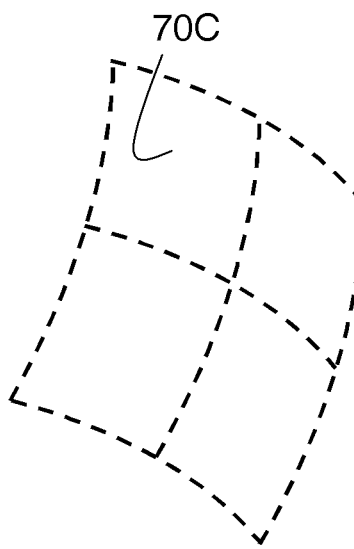
FIG. 9 is a plan drawing of a curved interface surface that has curvature in both horizontal and vertical directions.

FIG. 9 is a plan drawing of a curved interface surface 70C that has curvature in both horizontal and vertical directions. In some applications, the horizontal and vertical radii of curvature are the same, meaning that the interface surface 70C is spherically curved. This is the case as drawn in FIG. 9. In other applications, the horizontal and vertical radii of curvature are different, meaning that the interface surface has a single concavity but a more complex shape.

Figure 10:
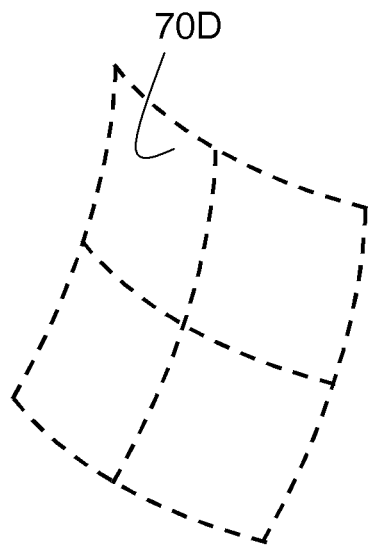
FIG. 10 is a plan drawing of a saddle-shaped interface surface, in which the vertical and horizontal curvatures have opposite concavity.

FIG. 10 is a plan drawing of a saddle-shaped interface surface 70D, in which the vertical and horizontal curvatures have opposite concavity. Note that the top pin mating surface and the bottom pin mating surface are both saddle-shaped, with surface profiles that are mated to form the interface surface 70D.

Figure 11:
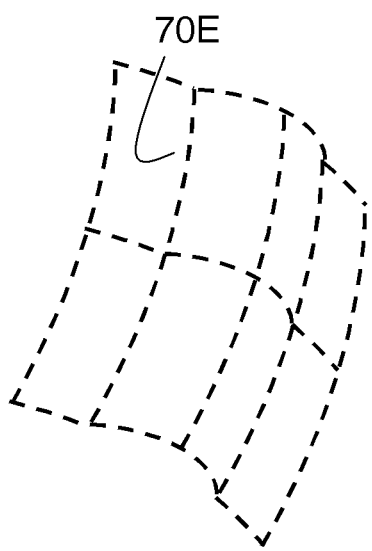
FIG. 11 is a plan drawing of an interface surface having a locating feature, such as a groove or ridge.

Finally, FIG. 11 is a plan drawing of an interface surface 70E having a locating feature, such as a groove or ridge. Note that the mating surface of one pin may have a groove, while the mating surface of the other pin has the complementary feature of a ridge that fits into the groove. Such a locating feature may restrict motion along a particular dimension or axis. As drawn in FIG. 11, the only possible relative motion of the mating surfaces is a largely vertical pivoting around the center of curvature; no horizontal relative motion is allowed by the locating feature.

Other suitable shapes, radii of curvature, concavity, and/or locating features are certainly possible, in addition to those shown in FIGS. 7 through 11. In each case, the top pin mating surface and bottom pin mating surface have complementary features, which may optionally restrict motion in a particular dimension or rotation along a particular direction. During use of the pins during testing, the compression of the pins retains intimate contact between the mating surfaces, and the contact is along the interface surface.

The top contact pad 21 can include any of a variety of features that may help enhance electrical contact with the ball terminal 2 on the device under test 1. Several of these are shown in FIG. 12-18.

Figure 12:
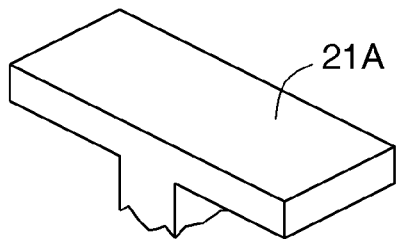
FIG. 12 is a plan drawing of a generally planar top contact pad.

FIG. 12 is a plan drawing of a generally planar top contact pad 21A.

Figure 13:
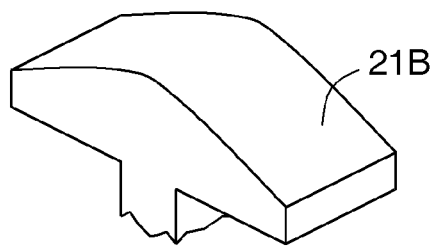
FIG. 13 is a plan drawing of a top contact pad that extends out of the plane of the pad.

FIG. 13 is a plan drawing of a top contact pad 21B that extends out of the plane of the pad. In the example shown in FIG. 13, the center of the contact pad 21B extends farther away from the top pin than the edges do, although this is not a requirement. In some cases, the top contact pad 21B is curved and is convex.

Figure 14:
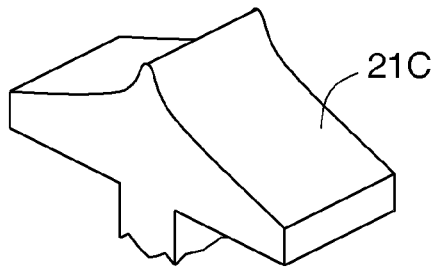
FIG. 14 is a plan drawing of a top contact pad that includes a protrusion out of the plane of the pad.

FIG. 14 is a plan drawing of a top contact pad 21C that includes a protrusion out of the plane of the pad. In the example shown in FIG. 14, the protrusion is essentially a line that extends through the center of the pad. In other cases, the line may be perpendicular to the one drawn in FIG. 14. In still other cases, the protrusion may be a point or protruding region, rather than a line. Alternatively, other protrusion shapes and orientations are possible. In some cases, the top contact pad 21C is curved and is concave. In other cases, the top contact pad 21C includes both concave and convex portions.

Figure 15:
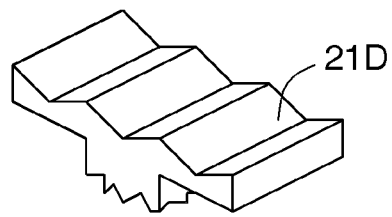
FIG. 15 is a plan drawing of a top contact pad that includes multiple protrusions out of the plane of the pad.

FIG. 15 is a plan drawing of a top contact pad 21D that includes multiple protrusions out of the plane of the pad. In the example shown in FIG. 14, the protrusions are essentially linear and parallel, although other shapes and orientations may also be used. In some cases, the top contact pad 21D includes only flat portions. In other cases, the top contact pad 21D includes both curved and flat portions. In some cases, the top contact pad 21D includes one or more edges or blades, which may be useful for the "wiping" action described above.

Figure 16:
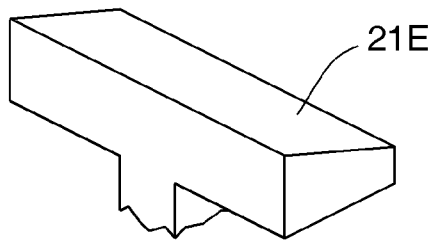
FIG. 16 is a plan drawing of an inclined top contact pad.

FIG. 16 is a plan drawing of an inclined top contact pad 21E. One possible advantage of having an inclination to the top contact pad is that it may encourage "wiping" of the terminal 2.

Figure 17:
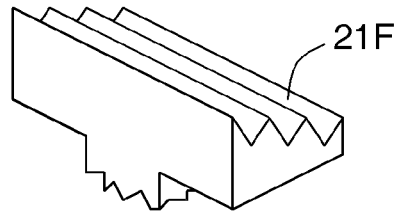
FIG. 17 is a plan drawing of an inclined top contact pad with multiple protrusions out of the plane of the pad.

FIG. 17 is a plan drawing of an inclined top contact pad 21F with multiple protrusions out of the plane of the pad. In addition to the inclination, the protrusions may also enhance "wiping" of the terminal 2. Here, the protrusions are grooves or ridges that are parallel to the direction of the ball wiping action. Alternatively, the grooves may be perpendicular to the ball wiping action, as in FIG. 15.

Figure 18:
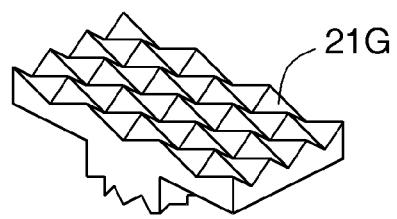
FIG. 18 is a plan drawing of a textured top contact pad.

FIG. 18 is a plan drawing of a textured top contact pad 21G. In some case, the texture is a series of repeating structures, which may be useful for "wiping" the terminal 2. In some cases, the top contact pad 21G is knurled. In some cases, the knurl or texture may be superimposed on a curved or otherwise shaped top contact pad.

Figure 19:
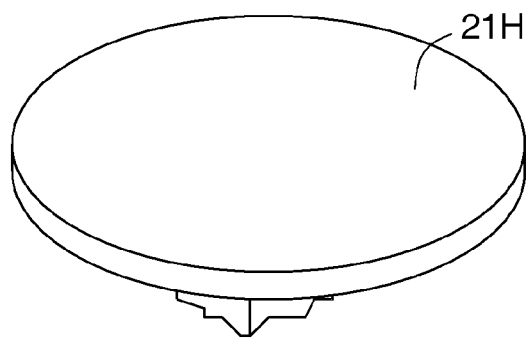
FIG. 19 is a plan drawing of a radially enlarged top contact pad.

FIG. 19 is a plan drawing of a radially enlarged top contact pad 21H. In practice, the maximum size that may be used may depend on the two-dimensional layout of the pins on the devices under test 1, the mechanical response of the interposer membrane (i.e., will the membrane longitudinally distort enough to ensure good contact between top and bottom pins), and so forth. In some cases, the shape or footprint of the top contact pad may be round, elliptical, skewed, rectangular, polygonal, square, or any other suitable shape. Furthermore, the top contact pad may have an enlarged footprint in combination with any of the inclinations, protrusions and textures described above.

Figure 20:
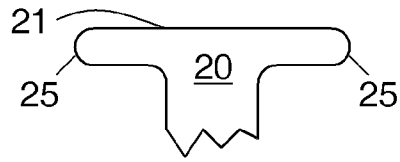
FIG. 20 is a side-view drawing of a top pin with a top contact pad that has rounded edges.

FIG. 20 is a side-view drawing of a top pin 20 with a top contact pad 21 that has rounded edges 25. In general, any or all of the edges in the top pin 20, and likewise, the bottom pin 30, may be rounded or sharp. Any rounded edges may be used with any or all of the pin features shown herein.

It should be noted that any combination of the features shown in FIGS. 12-20 may be used simultaneously. For instance, there may be a generally flat top pin contact pad (21A) that also has grooves in the length dimension (21F), or a top pin extending out of the plane (21B) that also has grooves in the length dimension (21F) and rounded edges (25). Any or all of these features may be mixed and matched as needed.

The top pin 20 and bottom pin 30 may optionally include one or more features that can allow the pins to be snapped into the interposer membrane 10. Some exemplary engagement and/or retention features are shown in FIG. 21-24.

Figure 21:
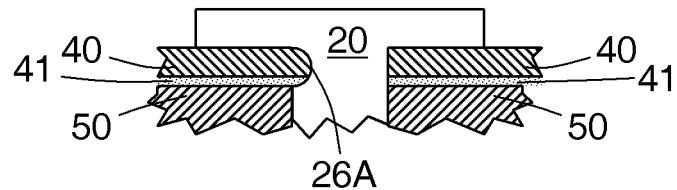
FIG. 21 is a side-view cross-sectional drawing of a top pin having a top pin engagement feature on one side.

FIG. 21 is a side-view cross-sectional drawing of a top pin 20 having a top pin engagement feature 26A on one side. In this case, the engagement feature is a horizontal depression, or lip, running along the underside of the top contact pad. Note that in some cases, the longitudinal member of the top pin is rectangular in profile, and the lip may run along one, two, three or all four edges of the top pin. When inserted into the hole in the interposer membrane, the top pin engagement feature 26A may engage all or a part of the top contact plate 40, and may optionally engage a portion of the foam or elastomer interposer 50. Such engagement allows the top pin 20 to be connected to the rest of the interposer membrane without adhesives and without any additional connection components. Additionally, such an engagement feature 26A may allow the interposer membrane to be assembled by first having the sandwich structure of the top plate, the foam and the bottom plates, with holes in the locations that will ultimately house pins, then by inserting each pin into a hole until the engagement feature catches the kapton contact plate. Each hole itself should be suitably sized to allow the pin to be snugly inserted up to the lip, albeit with a tight fit.

Figure 22:
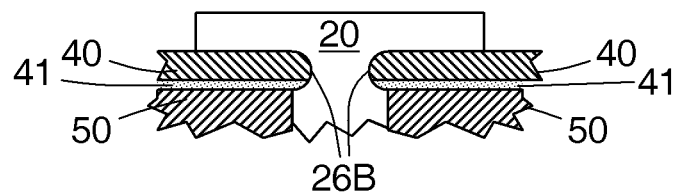
FIG. 22 is a side-view cross-sectional drawing of a top pin having a top pin engagement feature on two opposing sides.

FIG. 22 is a side-view cross-sectional drawing of a top pin 20 having a top pin engagement feature 26B on two opposing sides. This has the advantages of feature 26A shown in FIG. 21, with additional engagement and retention strength. For top pin longitudinal members that have a round cross-section, the lip 26B may extend all or partway around the circumference of the longitudinal member.

Figure 23:
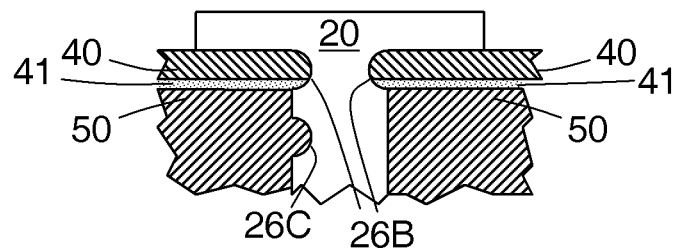
FIG. 23 is a side-view cross-sectional drawing of a top pin having a two top pin engagement features engaging the top contact plate, and one engagement feature engaging the foam interposer.

FIG. 23 is a side-view cross-sectional drawing of a top pin 20 having a two top pin engagement features 26B engaging the top contact plate, and one engagement feature 26C engaging the foam interposer 50. This also has additional engagement and retention strength. In some cases, it may be preferable to engage the bottom plate to the foam, rather than the top plate, so that the top plate is free to move without restriction. In some cases, the foam may not fully extend into the engagement feature, or may not extend at all into the engagement feature.

Figure 24:
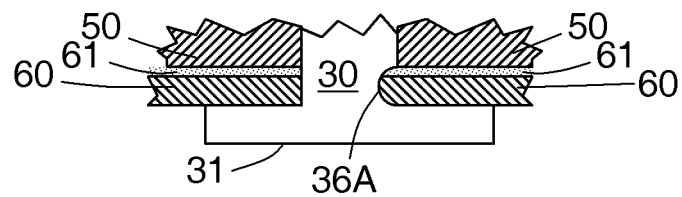
FIG. 24 is a side-view cross-sectional drawing of a bottom pin having a bottom pin engagement feature.

The bottom pin 30 may also have similar engagement and retention features. For instance, FIG. 24 shows an engagement feature or lip 36A that engages a portion of the bottom contact plate 60. Other configurations are possible, analogous to those for the top pin 20.

Figure 25:
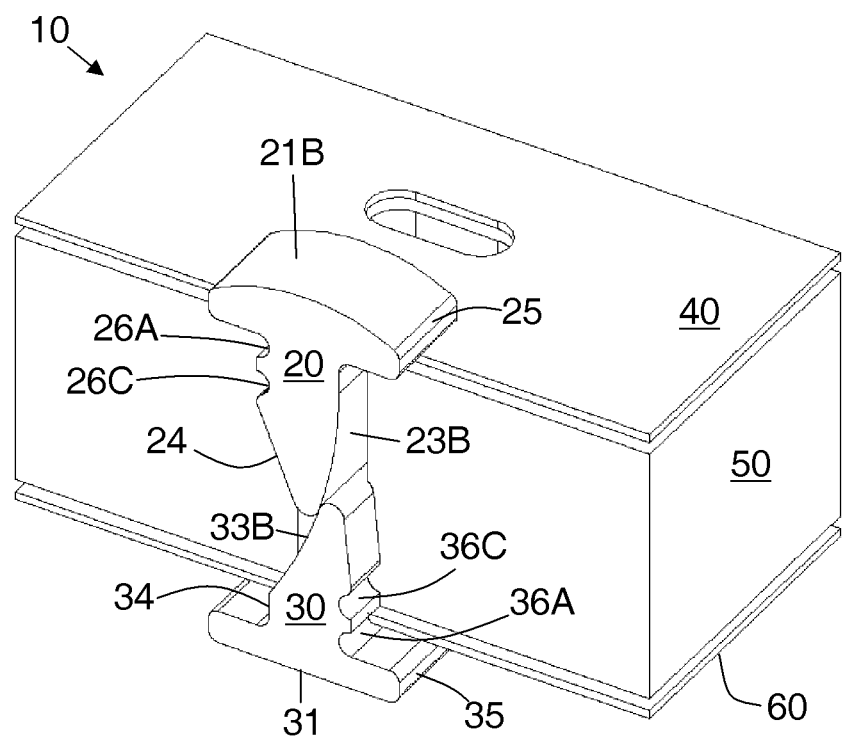
FIG. 25 is a perspective-view cross-sectional drawing of an exemplary interposer membrane.
Figure 26:
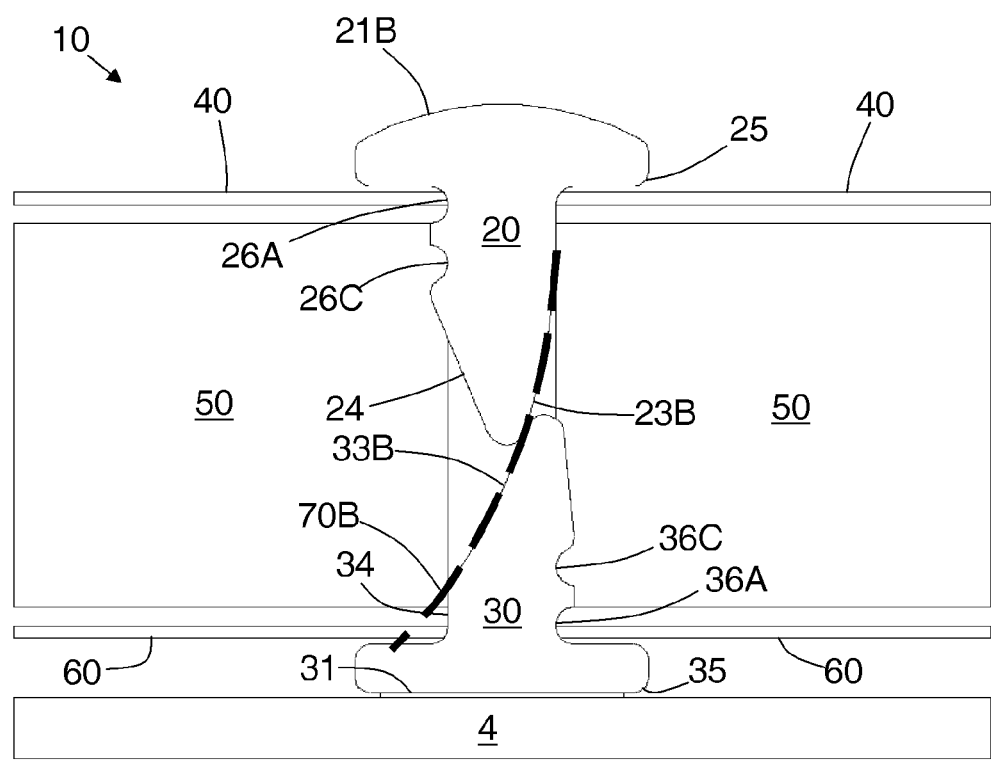
FIG. 26 is an end-on cross-sectional drawing of the interposer membrane of FIG. 25.
Figure 27:
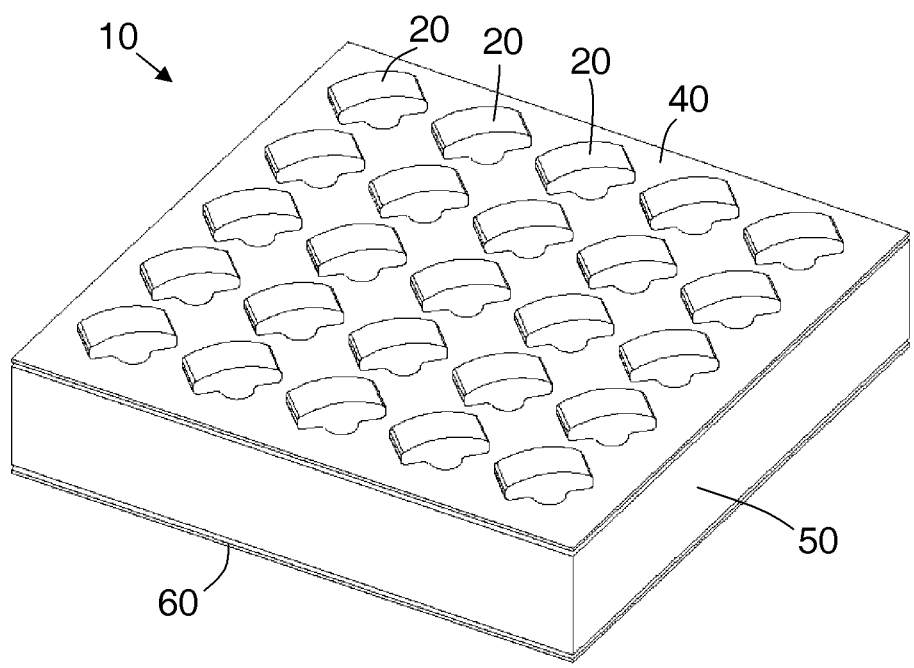
FIG. 27 is a plan drawing of the interposer membrane of FIGS. 25 and 26.

Several of the figures above show individual features or elements. FIGS. 25 through 27 show a more detailed example, in which many of the features are combined. Note that this is merely an example and should not be construed as limiting in any way.

FIG. 25 is a perspective-view cross-sectional drawing of an exemplary interposer membrane 10. FIG. 26 is an end-on cross-sectional drawing of the interposer membrane 10 of FIG. 25. FIG. 27 is a plan drawing of the interposer membrane 10 of FIGS. 25 and 26.

The terminals from a device under test contact respective top pins 20, and the contact pads 4 from a load board contact respective bottom pins 30. In this example, the top contact pad 21B is cylindrically curved and convex, and the bottom contact pad 31 is flat. The top and bottom contact pins slide past each other along mating surfaces 23B and 33B, which in this example are cylindrically curved. The mating surfaces 23B and 33B contact each other along a virtual, cylindrically curved interface surface 30B, denoted by the dashed line in FIG. 26. The pins have top and bottom relief surfaces 24, 34, which in this example are both oriented generally perpendicular to the membrane 10 when the pins are fully compressed. In this example, the top and bottom pin contact pads have rounded edges 25, 35. The top and bottom pins have engagement features 26A, 36A that engage the top and bottom contact plates, 40, 60, respectively, as well as optional engagement features 26C, 36C that engage the foam layer 50.

FIG. 27 shows an exemplary layout for the pins 20 in the membrane 10. In this example, the pins themselves are laid out in a generally square grid, corresponding to both the terminal and contact pad layouts of the device under test and the load board, respectively. Note that the footprint of the contact pad is oriented at a 45 degree angle with respect to the square grid, which allows for a larger contact pad than would be possible if the pad were extended along the square grid itself. Note also that the orientation of the interface surface 70B is at a 45 degree angle with respect to the square grid. In practice, the interface surface 70B may alternatively be oriented along the grid, or at any suitable angle with respect to the grid.

It is instructive to consider some elements that are particularly useful for so-called "Kelvin" testing. Unlike the one terminal/one contact pad testing described above, Kelvin testing measures the resistance between two terminals on the device under test. The physics of such a measurement is straightforward—we pass a known current (I) between the two terminals, measure the voltage difference (V) between the two terminals, and use Ohm's Law (V=IR) to calculate the resistance (R) between the two terminals.

In a practical implementation, each terminal on the device under test is electrically connected to two contact pads on the load board. One contact pad is effectively a current source or current sink, which supplies or receives a known amount of current. The other contact pad acts effectively as a voltmeter, measuring a voltage but not receiving or supplying a significant amount of current. In this manner, for each terminal on the device under test, one pad deals with I and the other deals with V.

While it is possible to use two separate pin pairs for each terminal, each pin pair corresponding to a single contact pad on the load board, there are drawbacks to this method. For instance, the tester would have to make two reliable electrical connections at each terminal, which would prove difficult for exceedingly small or closely spaced terminals. In addition, the membrane that holds the pin pairs would include essentially twice as many mechanical parts, which may increase the complexity and cost of such a membrane.

A better alternative is a pin mechanism that combines the electrical signals from two contact pads on the load board internally, so that only one top pin pad need make reliable contact with each terminal, rather than two distinct pins contacting each terminal. There are five possible pin schemes that can combine the two load board signals into a single top pin, each described briefly below.

First, the electrical signals are combined at the load board itself, as is the case for a single bottom contact pad that subtends two adjacent pads on the load board.

Second, the electrical signals are combined at the bottom pin. For this case, the membrane would include two distinct bottom contact pads, or a single bottom contact pad with an insulating portion that electrically separates one load board contact pad from the other.

Third, the electrical signals are combined at the top pin. For this case, the entire bottom pin is divided into two halves separated by an electrical insulator.

Fourth, the electrical signals are combined at the top contact pad, or equivalently, as close as possible to the terminal of the device under test. For this case, the entire bottom pin and much or all of the longitudinal member of the top pin are divided into two halves separated by an electrical insulator. The halves are electrically joined at the top contact pad, and are electrically isolated from each other below the top contact pad, i.e., between the top contact pad and the respective load board contact pad.

Finally, fifth, the electrical signals are combined only at the terminal of the device under test. The top contact pad, the top pin, the bottom pin, and the bottom contact pad(s) all include an electrical insulator that divides the pins and pad(s) into two electrically conductive portions that are electrically insulated from each other. In practical terms, the pins may be symmetrically bisected by the insulating material, so that a "left" half may be electrically insulated from a "right" half, where the "left" half electrically contacts one pad on the load board and the "right" half electrically contacts another pad on the load board.

In some cases, there are advantages to keeping the electrical signals isolated from each other along most or all of the longitudinal extent of the pins. If the signals are connected at the load board, there is an unnecessary redundancy, as if there were to two independent signal paths. In addition, connecting the signals at the load board may actually lower the associated inductances, since two inductances in parallel result in half the inductance.

An example of the fifth case above is shown in FIGS. 28 and 29.

FIG. 28 is a plan drawing of an exemplary top contact pad 121 for Kelvin testing, with an insulating portion 128 that separates the two conducting halves 127, 129 of the pad. In many cases, the insulating portion extends throughout the full longitudinal extent of the top pin, and effectively separates the pin into two conducting portions that are electrically insulated from each other. In many cases, the bottom pin may also include an analogous insulating portion that separates the bottom pin into two conducting portions that are electrically insulated from each other.

FIG. 29 is a side-view drawing of an exemplary pin pair 120, 130 for Kelvin testing, with an insulating ridge 180 that extends outward from the top pin mating surface 123. The ridge 180 may be generally planar and may extend through the entire top pin 120. The ridge 180 effectively bisects the top pin 120, and electrically insulates one half (facing the viewer in FIG. 29) from the other half (facing away from the viewer in FIG. 29). The ridge may be made from any suitable insulating material, such as kapton, and so forth.

The ridge 180 itself extends outward from the mating surface 123, and electrically insulates one half of the surface from the other. The mating surface 123 now includes two non-contiguous halves, separated by a ridge that extends outwardly from the surface. The corresponding mating surface 133 on the bottom pin 130 includes a suitable groove for accepting the ridge; the groove is an indentation along the mating surface 133 and is not shown in FIG. 29. In some cases, the groove may extend deeper than the ridge, so the "top" of the ridge does not contact the "bottom" of the groove at any point in the range of travel. This may be desirable, in that the mating surfaces 123 and 133 may share less common surface area, and may produce less friction as they move past each other. In other cases, the "top" of the ridge does contact the "bottom" of the groove. The ridge and groove structure serves to keep the mating surfaces aligned, as with the cases described above.

In some cases, the groove and ridge are both made from electrically insulating material, which separate the top and bottom pins each into two conducting portions that are electrically insulated from each other. This allows a single mechanical pin to be used for two independent electrical contacts, which is beneficial for Kelvin testing. Note that in FIG. 29, the groove on the bottom pin is hidden by surface 133, and would appear to the right of surface 133, much in the way that ridge 180 appears to the right of surface 123 in the top pin. The groove may be as deep or deeper than the ridge 180.

In some cases, the groove (not shown) would be sized to receive the ridge or land 180 and just wider than the ridge. With this sizing, the elements can slide by each other freely. In addition, the ridge-groove engagement provides a reliable track for sliding of the top and bottom elements 120, 130, thereby preventing skew or misalignment as the elements move with respect to each other. It is also possible to make the ridge and groove of an electrically conductive material (i.e., not a dielectric) where Kelvin testing capabilities are not needed. This may provide the same tracking capability and may also increase the electrical contact surface area.

The virtual interface surface 170 may differ slightly from the cases described above, in that it may not include the portion occupied by the ridge and groove structure. In these cases, the interface surface 170 may include two non-contiguous regions, one in the "front" and one in the "back", as drawn in FIG. 29. Each region may include planar, a cylindrically curved, or a spherically curved surface, as described above.

Note that in some cases, the interface surface may include discontinuities, such as a change in the radius of curvature. In general, such discontinuities are perfectly acceptable as long as the two mating surfaces 123 and 133 remain in contact for most or all of their full ranges of travel. For instance, the "front" portion may have one particular radius of curvature, and the "rear" portion may have a different radius of curvature, and the two centers of curvature may be coincident or collinear, to permit the mating surfaces to move and remain in contact. Other variations may include "stripes" along the mating surfaces, where each stripe may have its own particular radius of curvature, the radii all being coincident or collinear.

It will be understood that the ridge and groove of the top and bottom pins may be exchanged for a groove and ridge on the top and bottom pins, respectively. It will also be understood that the concavities of the top and bottom mating surfaces may be reversed as well.

Note that in the text and figures thus far, the membrane 10 has been shown as a sandwich structure, with two outer layers surrounding an inner layer. In general, the outer layers of this sandwich structure have different mechanical properties than the inner layer, with the outer layers being a semi-rigid thin film and the inner layer being a vertically resilient material. As an alternative, the sandwich structure may be replaced by a monolithic membrane, which may be formed as a single layer having a single set of mechanical properties. The outer surfaces of such a single monolithic layer would face the load board and device under test. In such cases, the membrane itself may be formed as a single layer having a set of vertically-oriented holes. The two pins are placed into the holes from the top and bottom.

Finally, we describe the interposer 50 in more detail.

The simplest design for the interposer is just a monolithic structure, with holes extending from the top contact plate to the bottom contact plate that can accommodate the pins. In this simplest design, the interposer material completely surrounds the holes, and has no internal structure aside from the holes themselves.

Other designs for the interposer are possible as well, including designs that incorporate some hollow space within the interposer itself. In these designs, the holes for the pins may resemble those in the monolithic design, but the interposer that surrounds these holes may have some structured hollow space in the regions surrounding the pin holes.

Figure 30:
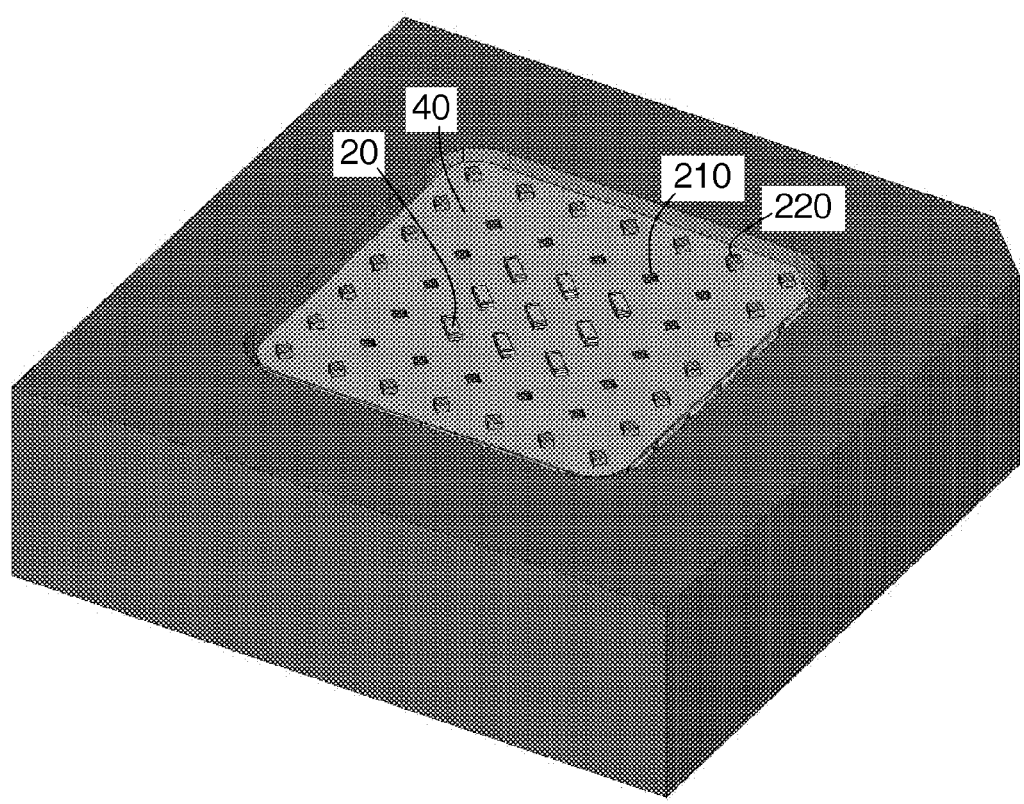
FIG. 30 is a plan drawing of an interposer membrane, inserted into a frame.
Figure 31:
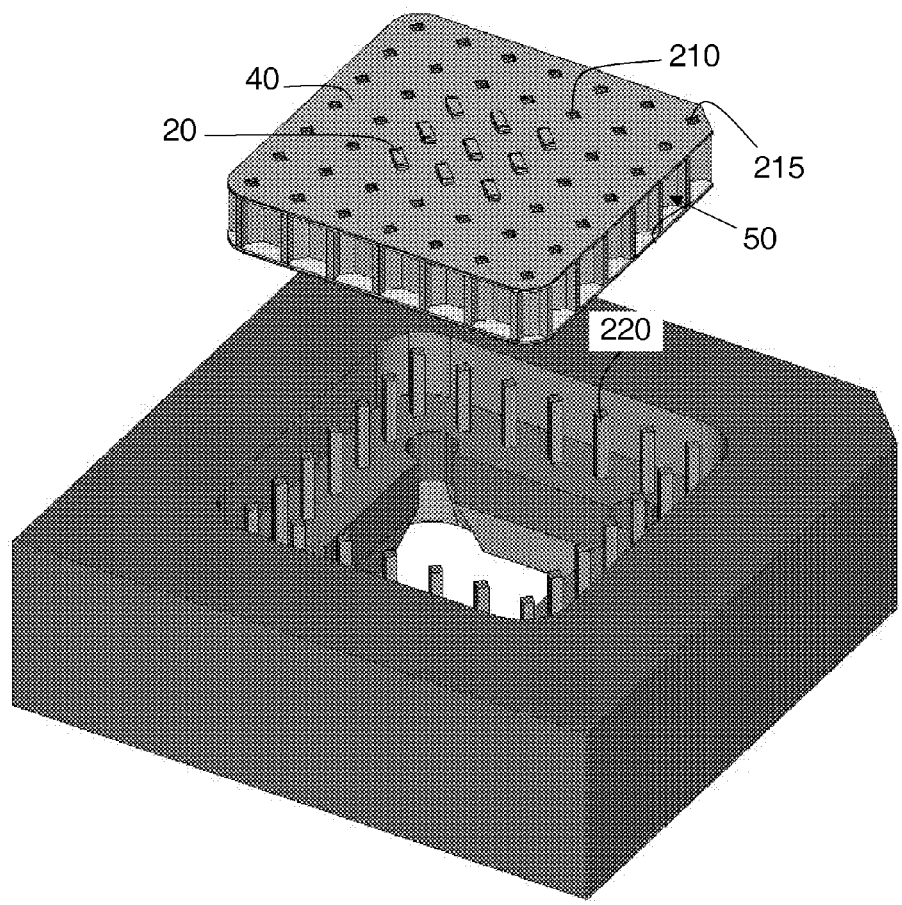
FIG. 31 is a plan drawing of the interposer membrane of FIG. 30, removed from the frame.
Figure 32A:
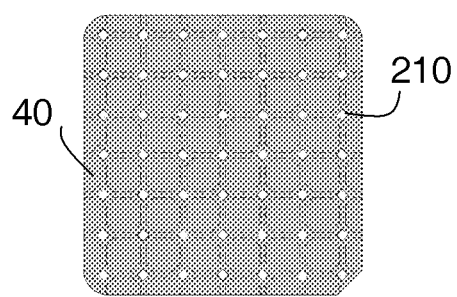
FIG. 32a is a top-view schematic drawing of the interposer membrane of FIGS. 30-31.
Figure 32B:
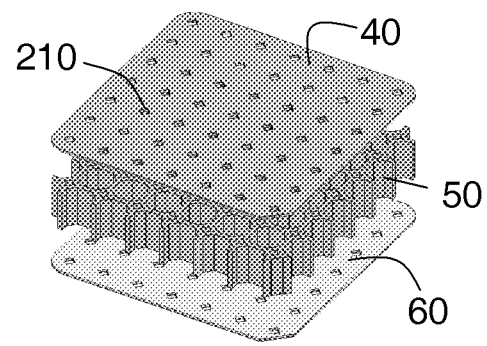
FIG. 32b is a plan drawing of the interposer membrane of FIGS. 30-31.
Figure 32C:
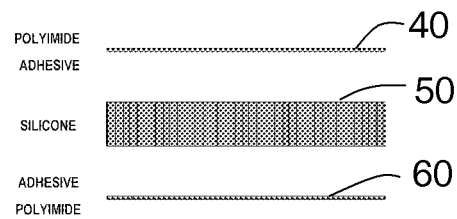
FIG. 32c is a front-view schematic drawing of the interposer membrane of FIGS. 30-31.
Figure 32D:
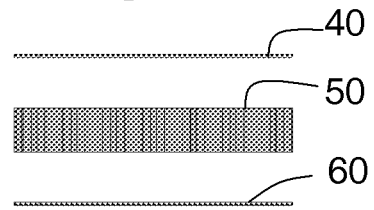
FIG. 32d is a right-side-view schematic drawing of the interposer membrane of FIGS. 30-31.
Figure 33A:
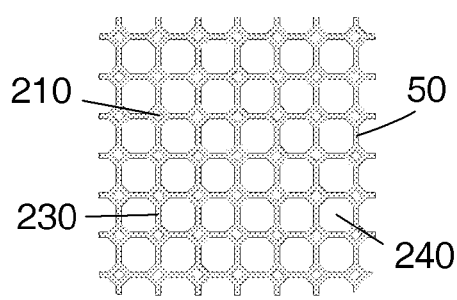
FIG. 33a is a top-view schematic drawing of the interposer, from the interposer membrane of FIGS. 30-32.
Figure 33B:
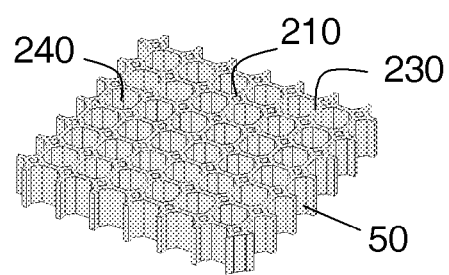
FIG. 33b is a plan drawing of the interposer, from the interposer membrane of FIGS. 30-32.
Figure 33C:
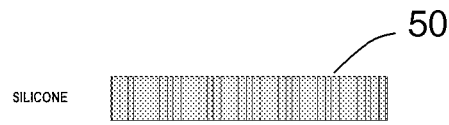
FIG. 33c is a front-view schematic drawing of the interposer, from the interposer membrane of FIGS. 30-32.
Figure 33D:
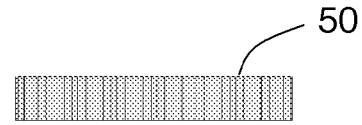
FIG. 33d is a right-side-view schematic drawing of the interposer, from the interposer membrane of FIGS. 30-32.

A specific example for such a structured interposer is shown in FIGS. 30-33. FIG. 30 is a plan drawing of an interposer membrane, inserted into a frame. FIG. 31 is a plan drawing of the interposer membrane of FIG. 30, removed from the frame. FIG. 32 is a four-view schematic drawing of the interposer membrane of FIGS. 30-31, with FIGS. 32a-d including top-view, plan view, front view and right-side view drawings, respectively. FIG. 33 is a four-view schematic drawing of the interposer, from the interposer membrane of FIGS. 30-32, with FIGS. 33a-d including top-view, plan view, front view and right-side view drawings, respectively.

In this specific example, the interposer 50 is structured as a honeycomb, with supporting members 230 that extend between the pin-supporting holes 210, and generally empty space 240 between the supporting members 230.

Figure 34:
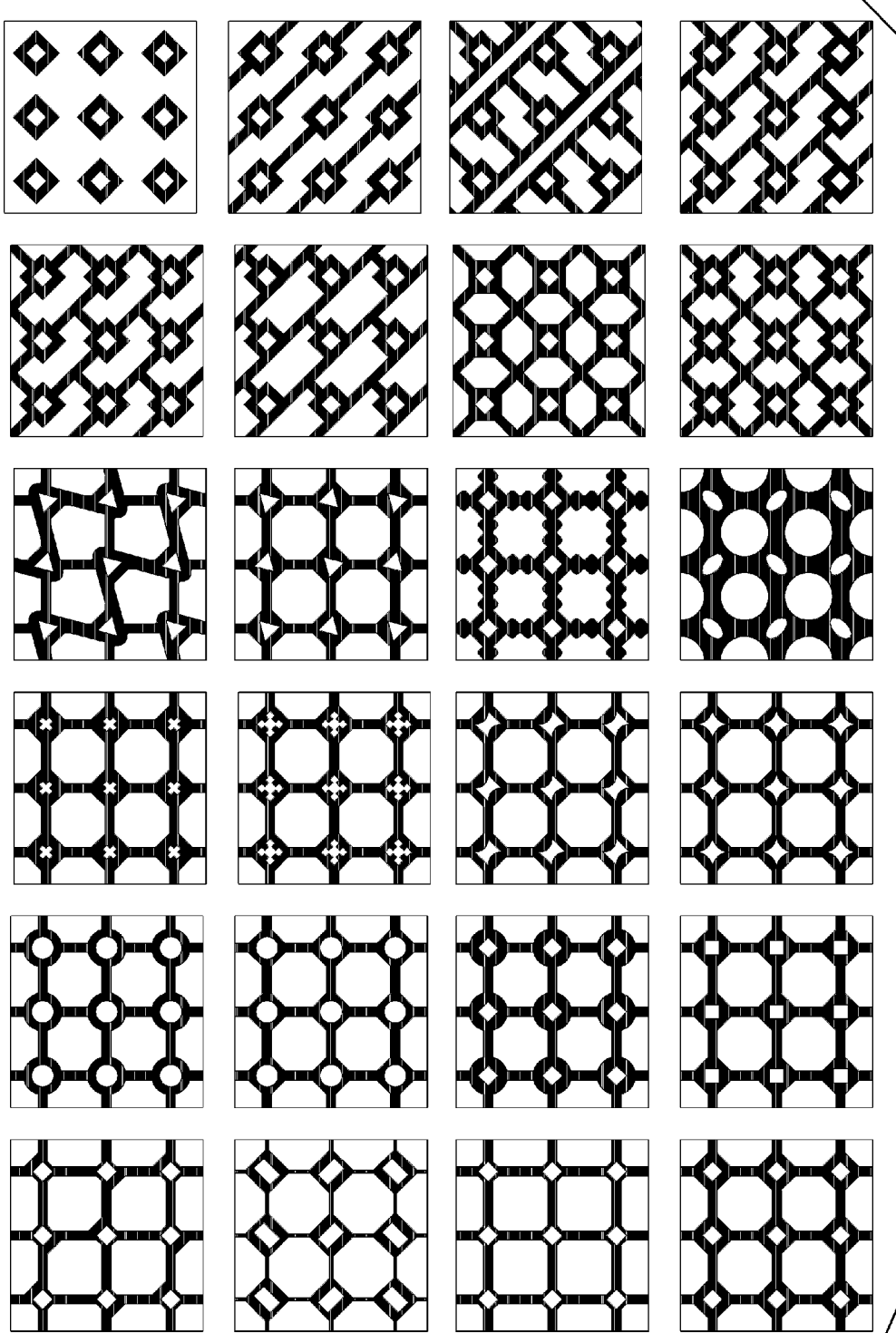
FIG. 34 includes 24 specific designs for the interposer supporting members, shown in cross-section.

There are many possible designs for the supporting members 230 within the interposer. FIG. 34 includes 24 specific designs for the interposer supporting members, shown in cross-section. The holes 210 and the supporting members 230 may take on any of a number of shapes, sizes and orientations.

In these examples, the supporting members 230 may extend from one pin-supporting hole to a directly-adjacent hole, or from one pin-supporting hole to a diagonally-adjacent hole. Other orientations, shapes and sizes are possible, as well.

In general, the specific design for the interposer is chosen to have particular mechanical characteristics, rather than specific aesthetic traits. It is desirable that the interposer be vertically resilient, and provide support and suitable resistance for the pins.

Figure 35:
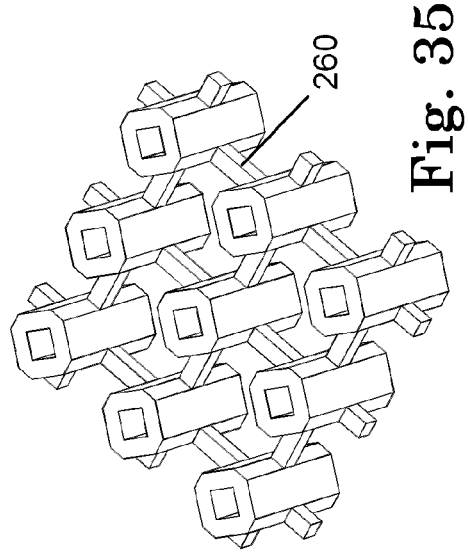
FIG. 35 is a plan drawing of an interposer having supporting members that extend between adjacent holes within a particular plane.
Figure 36:
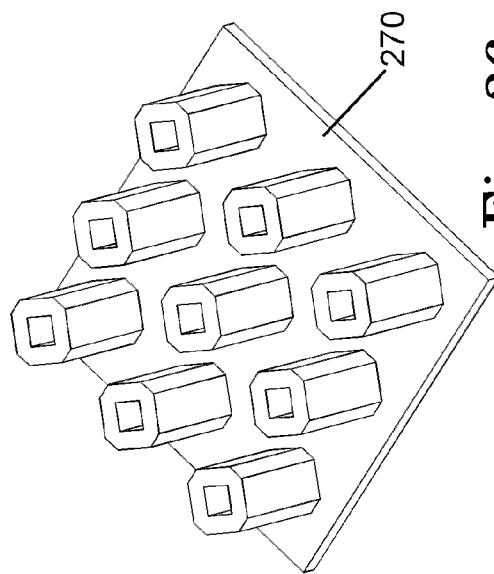
FIG. 36 is a plan drawing of an interposer having a supporting plane that completely fills the area between adjacent holes, but is absent above or below that plane.
Figure 37:
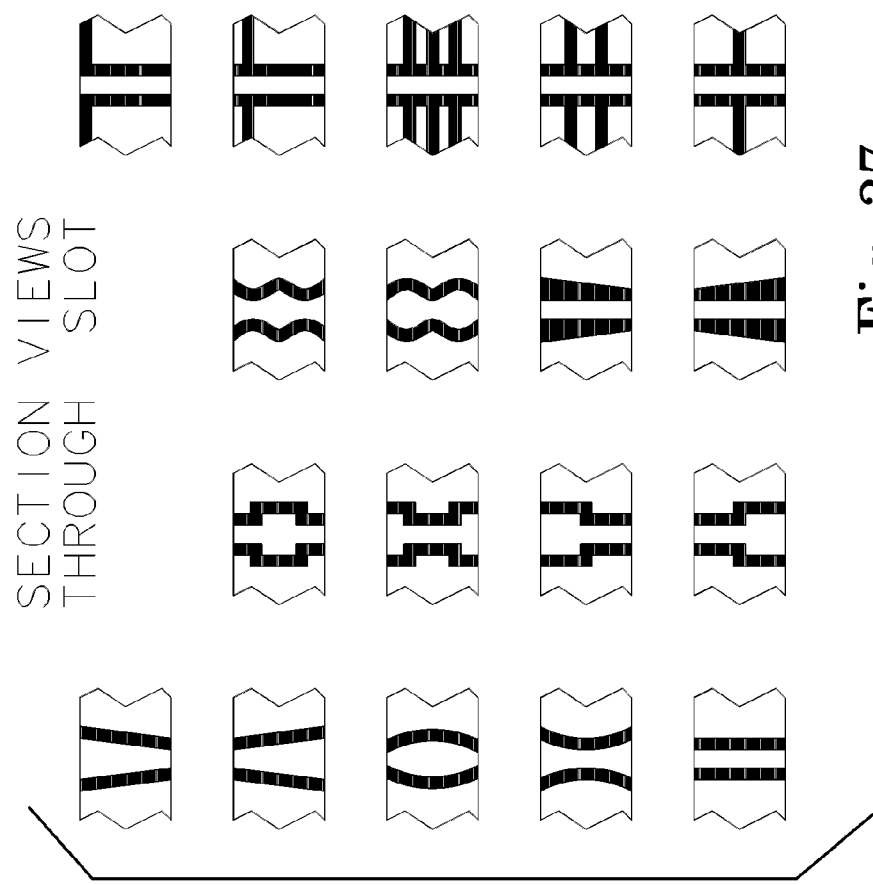
FIG. 37 includes 18 specific designs for the interposer, shown in cross-section, where the top and bottom contact plates are horizontally oriented, and the pin direction is generally vertical.

As seen in FIG. 34 showing 24 alternative structures, in addition to interposer structure that is generally cylindrical (i.e., each cross-section of the structure is the same, for all planes within the interposer that are parallel to the contact plates), there may also be out-of-the-plane structure. For instance, FIG. 35 is a plan drawing of an interposer having supporting/bridging members 260 that extend between adjacent holes within a particular plane, which may or may not be in the same plane as the top or bottom edges of the cylindrical structures. As another example, FIG. 36 is a plan drawing of an interposer having a supporting plane 270 that completely fills the area between adjacent holes, but is absent above or below that plane. FIG. 37 includes 18 specific designs for the interposer, shown in cross-section, where the top and bottom contact plates are horizontally oriented, and the pin direction is generally vertical. As seen from the drawing, many possible cross-sectional designs are possible.

In general, the interposer 50 need not be monolithic, and can include one or more hollow regions with a design that can vary within the plane of the interposer membrane (as in FIG. 34) and can vary out of the plane of the interposer membrane (as in FIG. 35). Mechanical performance of any interposer design may be simulated readily using finite element analysis.

There is one notable further feature of FIGS. 30 and 31. The frame in FIGS. 30 and 31 includes a series of preferably peripheral mounting posts 220 that extend through corresponding locating holes 215 in the interposer membrane. In FIGS. 30 and 31, the locating holes and posts are located around the perimeter of the membrane, although any suitable post and hole locations may be used. In general, these posts 220 are arranged with great lateral precision, so that when a membrane is placed onto the frame, the pins in the membrane are also placed with great lateral precision.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

PARTS LIST

1 Device under test
2 Terminal, or ball
3 Load board
4 Load board contact pad
5 Tester
6 Load board substrate
9 Electrical connection
10 Interposer membrane
20 Top pin, or slider pin
21, 21A, 21B, 21C, 21D, 21E, 21F, 21G, 21H Top contact pad
22 Top pin longitudinal member
23A, 23B Top pin mating surface
24 Top relief surface
25 Top contact pad rounded edge
26A, 26B, 26C Top pin engagement feature, or lip
30 Bottom pin, or base pin
31 Bottom contact pad
32 Bottom pin longitudinal member
33A, 33B Bottom pin mating surface
34 Bottom relief surface
35 Bottom contact pad rounded edge
36A, 36C Bottom pin engagement feature, or lip
40 Top contact plate (kapton, polyimide)
41 Adhesive
50 Interposer (foam, elastomer)
60 Bottom contact plate (kapton, polyimide)
61 Adhesive
70A, 70B, 70C, 70D, 70E, 70F Interface surface
120 Top pin
121 Top contact pad
123 Top pin mating surface
127 Front conducting half of top contact pad
128 Insulating material
129 Back conducting half of top contact pad
130 Bottom pin
133 Bottom pin mating surface
170 Interface surface
180 Insulating ridge
210 Pin-supporting holes
215 Locating holes
220 Locating pins
230 Supporting members
240 Empty space
260 Supporting members
270 Supporting plane

We claim:

1. A replaceable, longitudinally compressible membrane (10) for forming a plurality of temporary mechanical and electrical connections between a device under test (1) having a plurality of terminals (2) and a load board (3) having a plurality of contact pads (4), each contact pad (4) being laterally arranged to correspond to exactly one terminal (2), comprising:
   a flexible, electrically insulating top contact plate (40) longitudinally adjacent to the terminals (2) on the device under test (1);
   a flexible, electrically insulating bottom contact plate (60) longitudinally adjacent to the contact pads (4) on the load board (3);
   a longitudinally resilient, electrically insulating interposer (50) between the top and bottom contact plates (40, 60);
   a plurality of longitudinally compressible, electrically conductive pin pairs (20, 30) extending through longitudinal holes in the top contact plate (40), the interposer (50) and the bottom contact plate (60), each pin pair in the plurality being laterally arranged to correspond to exactly one terminal (2) on the device under test (1);
   wherein when a particular pin pair (20, 30) is longitudinally compressed, the pins (20, 30) in the pair slide past each other along a virtual interface surface (70) that is inclined with respect to a surface normal of the interposer (50).

2. The membrane (10) of claim 1, wherein the virtual interface surface (70A) is generally planar.

3. The membrane (10) of claim 1, wherein the virtual interface surface (70B) is curved along one dimension.

4. The membrane (10) of claim 1, wherein the virtual interface surface (70C) is curved along two dimensions.

5. The membrane (10) of claim 1, wherein the virtual interface surface (70D) is saddle-shaped.

6. The membrane (10) of claim 1, wherein the virtual interface surface (70E) includes one or more locating features.

7. The membrane (10) of claim 1, wherein the virtual interface surface includes one or more non-contiguous regions.

8. The membrane (10) of claim 1, wherein one of the pins (20) in each pin pair (20, 30) includes a textured contact pad (21E) for contacting the terminal (2) on the device under test (1).

9. The membrane (10) of claim 1, wherein one of the pins (20) in each pin pair (20, 30) includes an engagement feature (26) for securing the pin (20) to the top contact plate (40).

10. The membrane (10) of claim 1, wherein one of the pins (20) in each pin pair (20, 30) includes a depression (26) for securing the pin (20) to the top contact plate (40).

11. The membrane (10) of claim 1, wherein one of the pins (30) in each pin pair (20, 30) includes an engagement feature (36) for securing the pin (30) to the bottom contact plate (60).

12. The membrane (10) of claim 1, wherein the two pins in each pin pair (20, 30) are made from different metals.

13. The membrane (10) of claim 1, wherein when a particular pin pair (20, 30) is longitudinally compressed between the terminal (2) on the device under test (1) and the contact pad (4) on the load board (3), one of the pins (30) remains stationary and in contact with the contact pad (4) on the load board (3), and the other of the pins (20) moves while maintaining contact with the terminal (2) on the device under test (1).

14. The membrane (10) of claim 1, wherein each terminal (2) on the device under test (1) corresponds to exactly one contact pad (4) on the load board (3).

15. A test fixture (5), comprising:
a membrane (10) extending laterally between a device under test (1) and a load board (3), the device under test (1) including a plurality of electrical terminals (2) arranged in a predetermined pattern, the load board (3) including a plurality of electrical contact pads (4) arranged in a predetermined pattern corresponding to that of the terminals (2), the membrane having a top side facing the terminals (2) of the device under test (1) and a bottom side facing the contact pads (4) of the load board (3);
a plurality of electrical pin pairs (20, 30) supported by the membrane (10) in a predetermined pattern corresponding to that of the terminals (2), each pin pair in the plurality comprising:
a top pin (20) extending through the top side of the membrane (10) and having a top pin mating surface (23); and
a bottom pin (30) extending through the bottom side of the membrane (10) and having a bottom pin mating surface (33);
wherein the top and bottom pin mating surfaces (23, 33) have complementary surface profiles;
wherein when the corresponding electrical terminal (2) is forced against the pin pair, the top and bottom pin mating surfaces (23, 33) slide along each other along a virtual interface surface (70); and
wherein the virtual interface surface (70) is inclined with respect to a surface normal of the membrane (10).

16. The test fixture (5) of claim 15, wherein at least two of the membrane layers in the plurality have different mechanical properties.

17. A test fixture (5) for forming a plurality of temporary mechanical and electrical connections between a device under test (1) having a plurality of terminals (2) and a load board (3) having a plurality of contact pads (4), the terminals (2) and contact pads (4) being arranged in a one-to-one correspondence, comprising:
a replaceable interposer membrane (10) disposed generally parallel to and adjacent to the load board (3), the interposer membrane (10) including a plurality of pin pairs (20, 30) arranged in a one-to-one correspondence with the plurality of terminals (2), each pin pair (20, 30) including a top pin (20) adjacent to the corresponding terminal (2) and extending into the interposer membrane, and a bottom pin (30) adjacent to the corresponding contact pad (4) and extending into the interposer membrane (10);
wherein each contact pad (4) corresponding to a particular pin pair (20, 30) is configured to mechanically and electrically receive the terminal (2) on the device under test (1) corresponding to the particular pin pair (20, 30); and
wherein when the device under test (1) is attached to the test fixture (5), the top pins (20) contact the corresponding terminals (2) on the device under test (1), the bottom pins (30) contact the corresponding contact pads (4) on the load board (3), each top pin (20) contacts the corresponding bottom pin (30) along a virtual interface surface that is inclined with respect to a surface normal of the interposer membrane (10), and
the plurality of terminals (2) on the device under test (1) are electrically connected in a one-to-one correspondence to the plurality of contact pads (4) on the load board (3).

18. The test fixture (5) of claim 17, wherein at least two of the membrane layers in the plurality have different mechanical properties.

19. The test fixture (5) of claim 17, wherein the membrane (10) is monolithic.

20. A method of testing integrated circuit components via a test fixture having
a flexible, electrically insulating top contact plate, a flexible, electrically insulating bottom contact plate longitudinally, a longitudinally resilient, electrically insulating interposer between the top and bottom contact plates, at least a pair of electrically conductive partially overlapping pins having mutually inclined contact surfaces and said pairs extending through longitudinal holes in the top contact plate, the interposer and the bottom contact plate,
the method comprising the steps of laterally biasing each of said partially overlapping pin pairs in contact in their overlapping region while along said inclined contact surfaces said pin pairs are compressed longitudinally toward each other during component testing
so that the pin pairs slide past each other during testing but are maintained in electrical contact.

* * * * *